(12) United States Patent
Hatakeyama et al.

(10) Patent No.: US 7,135,269 B2
(45) Date of Patent: Nov. 14, 2006

(54) POLYMER, RESIST COMPOSITION AND PATTERNING PROCESS

(75) Inventors: Jun Hatakeyama, Niigata-ken (JP); Takanobu Takeda, Niigata-ken (JP); Osamu Watanabe, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 190 days.

(21) Appl. No.: 10/765,919

(22) Filed: Jan. 29, 2004

(65) Prior Publication Data
US 2005/0260521 A1   Nov. 24, 2005

(30) Foreign Application Priority Data
Jan. 30, 2003 (JP) .............................. 2003-021416
Jul. 9, 2003 (JP) .............................. 2003-194033

(51) Int. Cl.
*G03C 1/73* (2006.01)
*G03F 7/039* (2006.01)
*G03F 7/30* (2006.01)
*G03F 7/36* (2006.01)
*C08F 30/08* (2006.01)
*C08F 24/00* (2006.01)

(52) U.S. Cl. ................. 430/270.1; 430/326; 430/330; 430/313; 526/279; 526/266; 526/270; 526/273

(58) Field of Classification Search ..................... None
See application file for complete search history.

(56) References Cited

U.S. PATENT DOCUMENTS

| | | | |
|---|---|---|---|
| 4,491,628 A | 1/1985 | Ito et al. | 430/176 |
| 5,310,619 A | 5/1994 | Crivello et al. | 430/270.1 |
| 6,492,089 B1 | 12/2002 | Hatakeyama et al. | 430/270.1 |

(Continued)

FOREIGN PATENT DOCUMENTS

JP   63-27829 A   2/1988

(Continued)

OTHER PUBLICATIONS

DERWENT English abstract for JP 2001-278918 (Hatakeyama et al).*

(Continued)

*Primary Examiner*—Sin Lee
(74) *Attorney, Agent, or Firm*—Birch, Stewart, Kolasch & Birch, LLP

(57) ABSTRACT

A polymer comprising recurring units containing silicon and recurring units having a substituent group of formula (1) is novel wherein $A^1$ is a divalent group selected from furandiyl, tetrahydrofurandiyl and oxanorbornanediyl, $R^1$ and $R^2$ are selected from monovalent $C_1$–$C_{10}$ hydrocarbon groups, or $R^1$ and $R^2$ taken together may form an aliphatic hydrocarbon ring with the carbon atom, and $R^3$ is hydrogen or a monovalent $C_1$–$C_{10}$ hydrocarbon group which may contain a hetero atom. The polymer is useful as a base resin to formulate a resist composition which is sensitive to high-energy radiation, and has excellent sensitivity and resolution at a wavelength of less than 300 nm as well as satisfactory oxygen plasma etching resistance.

(1)

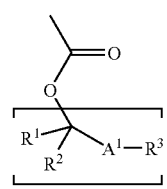

14 Claims, 2 Drawing Sheets

U.S. PATENT DOCUMENTS

| | | | |
|---|---|---|---|
| 2002/0132182 A1* | 9/2002 | Nishi et al. | 430/270.1 |
| 2002/0168581 A1* | 11/2002 | Takeda et al. | 430/270.1 |
| 2003/0224291 A1 | 12/2003 | Hatakeyama et al. | 430/270.1 |
| 2004/0068124 A1* | 4/2004 | Hasegawa et al. | 549/397 |

FOREIGN PATENT DOCUMENTS

| | | |
|---|---|---|
| JP | 2-27660 B2 | 6/1990 |
| JP | 6-118651 A | 4/1994 |
| JP | 9-73173 A | 3/1997 |
| JP | 9-110938 A | 4/1997 |
| JP | 9-230595 A | 9/1997 |
| JP | 10-10739 A | 1/1998 |
| JP | 10-324748 A | 12/1998 |
| JP | 11-302382 A | 11/1999 |
| JP | 2001-158808 A | 6/2001 |
| JP | 2001-278918 A | 10/2001 |
| JP | 2002-055456 A | 2/2002 |
| WO | WO 97/33198 | 9/1997 |

OTHER PUBLICATIONS

International Work Shop 157nm Lithography MIT-LL, Boston, MA May 5, 1999.

Kunz et al., Outlook for 157 nm resist design, J. Vac. Sci. Technol., B17 (6), Nov./Dec. 1999, pp. 3267-3272.

Chiba et al., 157nm Resist Materials; A Progress Report, J. Photopolymer Sci. and Technol., vol. 13, No. 4 (2000) pp. 657-664.

Schmaljohann et al., Fundamental Studies of Fluoropolymer Photoresists for 157 nm Lithography, J. Photopolymer Sci. and Technol., vol. 13, No. 3 (2000) pp. 451-458.

Brunsvold et al., Evaluation of a Deep UV Bilayer Resist for Sub-Half Micron Lithography, SPIE vol. 1925 (1993), pp. 377-387.

Hatakeyama et al., Investigation of Discrimination Enhancement in Polysilsesquioxane Based Positive Resist for ArF Lithography, SPIE vol. 3333 (1998), pp. 62-72.

Schaedeli et al., Evaluation of Materials for 193-nm Lithography, J. Photopolymer Sci. and Technol., vol. 9, No. 3 (1996), pp. 435-446.

Kessel et al., Novel Silicon-Containing Resists for EUV and 193 nm Lithography, SPIE vol. 3678, (1999), pp. 214-220.

Lin et al., A High Resolution 248 nm Bilayer Resist, SPIE vol. 3678, (1999), pp. 241-250.

Boardman et al., Chemical Aspects of Silicon-Containing Bilayer Resists, SPIE vol. (1999), 3678 pp. 562-572.

Kim et al., Chemically amplified resist based on the methacrylate polymer with 2-trimethylsilyl-2-propyl ester protecting group, SPIE vol. 3999 (2000), pp. 420-428.

Ushirogouchi et al., Advanced Materials For 193-nm Resists, SPIE vol. 3999 (2000), pp. 1147-1156.

\* cited by examiner

POLYMER, RESIST COMPOSITION AND PATTERNING PROCESS

This Nonprovisional application claims priority under 35 U.S.C. § 119(a) on Patent Application No(s). 2003-021416 and 2003-194033 filed in JAPAN on Jan. 30, 2003 and Jul. 9, 2003, the entire contents of which are hereby incorporated by reference.

This invention relates to polymers suitable for use as the base polymer in chemically amplified positive resist compositions used for micropatterning in a process for the fabrication of semiconductor devices or the like. It also relates to chemically amplified positive resist compositions adapted for exposure to high-energy radiation such as deep-UV, KrF excimer laser light (248 nm), ArF excimer laser light (193 nm), $F_2$ laser light (157 nm), electron beams or x-rays, and a process for forming a pattern.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF excimer laser (248 nm) brought about a significant innovation, contributing to the mass-scale production of 0.25 micron rule and subsequent devices. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, passed through the 0.25 micron rule, and currently entered the mass production phase on the 0.18 micron rule. Engineers have attempted test fabrication on the 0.15 micron rule and started investigation on the 0.13 micron rule, with the trend toward a finer pattern rule being accelerated. A wavelength change-over from KrF to shorter wavelength ArF excimer laser (193 nm) is expected to enable miniaturization of the design rule to 0.13 µm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 µm or less, more difficulty arises in insuring transparency because it was found that acrylic resins are not transmissive to light at all and those cycloolefin resins having carbonyl bonds have strong absorption. Polymers having benzene rings have a somewhat improved transmittance in proximity to 160 nm wavelength, which is far below the practically acceptable level. It was found that in single layer resists, reducing carbon-to-carbon double bonds as typified by benzene rings and carbon-to-oxygen double bonds as typified by carbonyl groups is essential for insuring a light transmittance (see International Work Shop 157 nm Lithography MIT-LL, Boston, Mass., May 5, 1999). It was reported in J. Vac. Sci. Technol., B17(6), November/December 1999 that introduction of fluorine is effective to improve transmittance. A number of fluorinated polymers for resist compositions were proposed in J. Photopolymer Sci. and Technol., Vol. 13, No. 4 (2000), pp. 657–664 and pp. 451–458. However, the transmittance of these polymers does not reach that of polyhydroxystyrene and derivatives thereof adapted for KrF exposure and poly(meth)acrylic derivatives and polycycloolefin derivatives adapted for ArF exposure.

As is known in the art, the two-layer resist method is advantageous in forming a high-aspect ratio pattern on a stepped substrate. It is also known that in order that a two-layer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF laser exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see JP-A 6-118651 and SPIE vol. 1925 (1993), p. 377). Positive resist compositions comprising as a base a silsesquioxane of the type in which cyclohexylcarboxylic acid is substituted with an acid labile group were proposed for ArF laser exposure (see JP-A 10-324748, JP-A 11-302382, and SPIE vol. 3333 (1998), p. 62). Positive resist compositions comprising a silsesquioxane having hexafluoroisopropanol as a dissolvable group as a base were proposed for $F_2$ laser exposure (see JP-A 2002-55456). The above polymer bears in its backbone a polysilsesquioxane containing a ladder skeleton produced through polycondensation of a trialkoxysilane or trihalosilane.

Silicon-containing (meth)acrylate polymers were proposed as a resist base polymer having silicon pendants (see JP-A 9-110938, J. Photopolymer Sci. and Technol., Vol. 9, No. 3 (1996), pp. 435–446).

The silicon-containing polymer of the (meth)acrylate type has the drawback that its resistance to dry etching with oxygen plasma is weak as compared with the silsesquioxane polymer. A low silicon content and a different polymer main skeleton account for this weak dry etching resistance. The (meth)acrylate of siloxane pendant type also has the drawback of poor developer wetting that it is likely to repel a developer solution. SPIE vol. 3678 (1999), pp. 214, 241 and 562 describes a polymer comprising (meth)acrylate of the trisilane or tetrasilane pendant type having an increased silicon content and a silicon-containing substituent which can be eliminated with acid so that the polymer is improved in alkali dissolution. Despite low transmittance at a wavelength of less than 200 nm due to silicon-to-silicon bonds, this polymer is so transparent to KrF excimer laser beams of 248 nm that it is a useful polymer having a silicon-containing acid-eliminatable group and improved etching resistance. Besides, silicon-containing acid labile groups other than the foregoing have been investigated as reported in SPIE vol. 3678 (1999), p. 420.

The applicant/assignee proposed novel acid labile groups having silicon introduced therein in JP-A 2001-278918 and JP-A 2001-158808 (U.S. Pat. No. 6,492,089). These polymers have the advantages of an improved acid elimination ability and prevention of T-top profiling as well as the advantageous feature that they are fully transparent at the wavelength of ArF excimer laser because of the inclusion of a carbon atom between silicon atoms and the exclusion of a silicon-to-silicon bond.

Drawbacks of the silicon-containing resist compositions include poor line edge roughness and the generation of scum on substrates. Silicon-containing groups, especially alkyl-substituted silyl groups are extremely hydrophobic so that they interfere with development with alkaline water and incur swelling. As a result, the line edge roughness is exaggerated, and residues following dissolution become scum on the substrate or resist pattern.

It is reported in SPIE vol. 3999 (2000), p. 1147 that sensitivity and resolution are improved by imparting hydrophilic property to not only adhesive groups, but also to acid labile groups. Although this deals with an ArF single layer resist, an improvement in hydrophilicity will be effective for reducing the swelling of an ArF single layer resist using an aliphatic ring which is more water repellent and liable to swell in aqueous alkaline developer. In the event of silicon-containing groups which are more water repellent than the aliphatic ring, it is necessary to enhance hydrophilicity.

SUMMARY OF THE INVENTION

An object of the invention is to provide a polymer and a chemically amplified positive resist composition comprising the same, which exhibit a high sensitivity and a high resolution because of a high dissolution contrast, and have the advantages of no swell during development, minimized line edge roughness and no generation of residues, despite an increased silicon content, and are especially suitable as a material for use in the two-layer resist method adapted to form a high-aspect ratio pattern. Another object of the invention is to provide a process for forming a pattern using the same.

The inventors have found that a polymer comprising recurring units bearing a hydrophilic acid labile group of any of the general formulae (1) to (3), shown below, and recurring units containing silicon, typically recurring units bearing a silicon-containing substituent group of any of the general formulae (10) to (16) has a high sensitivity and resolution, and undergoes no swell during development, exhibits minimized line edge roughness and yields no residues, even when the silicon content is increased. The polymer is then advantageously used in the two-layer resist method adapted to form a high-aspect ratio pattern.

When a resist composition comprising a polymer having a silicon-containing group, especially an alkyl-substituted silyl group is developed, substantial line edge roughness or residues are observed. This is presumably because alkylsilyl groups are highly water repellent as previously indicated. Highly hydrophilic groups should be introduced in order to offset the high water repellency of alkylsilyl groups.

The inventors proposed in Japanese Patent Application No. 2002-130326 (U.S. Ser. No. 10/427,939) to copolymerize adhesive groups containing a 7-oxonorbornane ring in order to render silicon-containing polymers more hydrophilic. Presumably, on account of ring strain exerted at the 7-position of norbornane corresponding to the bridgehead, the unpaired electron on the oxygen atom introduced thereat is strongly forced outward of the ring whereby the polymer is endowed with high polarity.

Placing the focus on this phenomenon, the inventors attempted to synthesize a monomer bearing an acid eliminatable group having a 7-oxonorbornane ring and to copolymerize it with a silicon-containing monomer. As a result, the inventors have found that an acid labile group simultaneously serving as a hydrophilic group, when copolymerized in a polymer, is effective for rendering the polymer highly dissolvable in alkaline water and also effective for preventing the polymer from swelling.

Accordingly, a first aspect of the present invention provides a polymer. In a first embodiment, a polymer is provided comprising recurring units containing silicon and recurring units having a substituent group of the general formula (1).

Herein $A^1$ is a divalent group selected from furandiyl, tetrahydrofurandiyl and oxanorbornanediyl, $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached, and $R^3$ is hydrogen or a straight, branched or cyclic monovalent hydrocarbon group of 1 to 10 carbon atoms which may contain a hetero atom.

In a second embodiment, a polymer is provided comprising recurring units containing silicon and recurring units having a substituent group of the general formula (2).

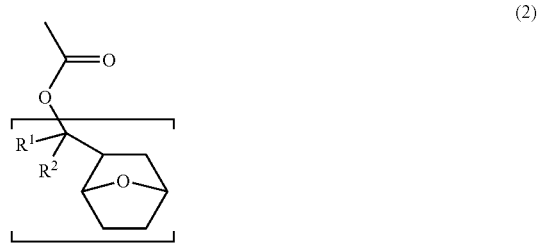

Herein $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached.

In a third embodiment, a polymer is provided comprising recurring units containing silicon and recurring units having a substituent group of the general formula (3).

Herein $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached, and $R^{4a}$ and $R^{4b}$ each are a single bond or an alkylene or alkenylene group of 1 to 4 carbon atoms, the total number of carbon atoms in $R^{4a}$ and $R^{4b}$ being from 3 to 6.

Specifically, a polymer is provided comprising recurring units containing silicon and recurring units of at least one type selected from the general formulae (4) to (8).

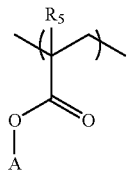
(4)

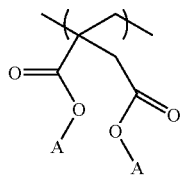
(5)

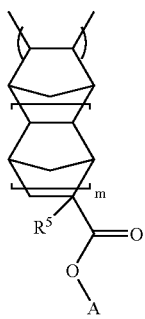
(6)

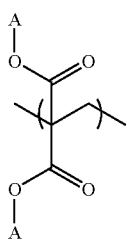
(7)

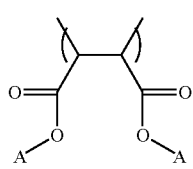
(8)

Herein $R^5$ is hydrogen or methyl, m is 0 or 1, A is a group selected from the following formulae (1a), (2a) and (3a), a plurality of A's may be the same or different,

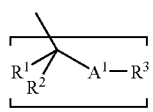
(1a)

-continued

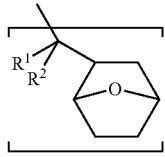
(2a)

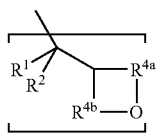
(3a)

wherein $A^1$ is a divalent group selected from furandiyl, tetrahydrofurandiyl and oxanorbornanediyl, $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached, and $R^3$ is hydrogen or a straight, branched or cyclic monovalent hydrocarbon group of 1 to 10 carbon atoms which may contain a hetero atom, and $R^{4a}$ and $R^{4b}$ each are a single bond or an alkylene or alkenylene group of 1 to 4 carbon atoms, the total number of carbon atoms in $R^{4a}$ and $R^{4b}$ being from 3 to 6.

In a preferred embodiment, the recurring units containing silicon have the general formula (9).

$$\text{(9)}$$

Herein $R^5$ is hydrogen or methyl, and $R^6$ is a silicon-containing group selected from the general formulae (10), (11), (12), (13), (14), (15) and (16):

$$\text{(10)} \quad R^7-\underset{\underset{R^{11}}{\overset{CH_2}{|}}}{\overset{R^8}{|}}-R^{10}$$

$$\text{(11)} \quad R^{15}-\underset{\underset{R^{12}-Si-R^{14}}{\overset{CH_2}{|}}}{\overset{R^{12}}{|}}-CH_2-\underset{R^{14}}{\overset{R^{12}}{|}}-R^{13}$$

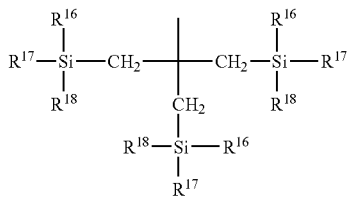
(12)

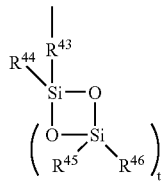
(15)

wherein each of $R^7$, $R^8$ and $R^{15}$ is hydrogen or a straight, branched or cyclic alkyl group of 1 to 10 carbon atoms, each of $R^9$, $R^{10}$, $R^{11}$, $R^{12}$, $R^{13}$, $R^{14}$, $R^{16}$, $R^{17}$ and $R^{18}$ is a straight, branched or cyclic alkyl group of 1 to 10 carbon atoms, an aryl group of 6 to 10 carbon atoms, a trialkylsilyl group, or a silicon-containing group which forms a siloxane or silalkylene bond with the silicon atom in each formula, or $R^7$ and $R^8$ taken together may form an aliphatic hydrocarbon ring of 3 to 10 carbon atoms with the carbon atom to which they are attached, a pair of $R^9$ and $R^{10}$, $R^9$ and $R^{11}$, $R^{10}$ and $R^{11}$, $R^{12}$ and $R^{13}$, $R^{12}$ and $R^{14}$, $R^{13}$ and $R^{14}$, $R^{16}$ and $R^{17}$, $R^{16}$ and $R^{18}$, and $R^{17}$ and $R^{18}$, taken together, may form a polysiloxane ring of 3 to 10 silicon atoms with the silicon atom to which they are attached, wherein $R^{43}$ is an alkylene group of 2 to 4 carbon atoms, each of $R^{44}$, $R^{45}$ and $R^{46}$ is a straight, branched or cyclic alkyl group of 1 to 10 carbon atoms or an aryl group of 6 to 10 carbon atoms, t is an integer of 2 to 10,

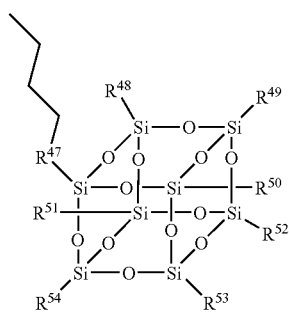
(16)

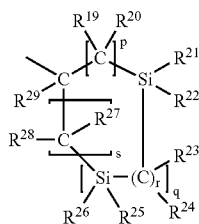
(13)

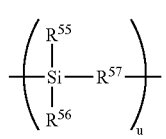
(17)

wherein each of $R^{48}$ to $R^{54}$ is independently hydrogen or a straight, branched or cyclic alkyl or fluorinated alkyl group of 1 to 10 carbon atoms, which may contain an ether, lactone, ester, hydroxy or cyano group, $R^{47}$ is a single bond or a linking group of formula (17), $R^{55}$ and $R^{56}$ each are a straight, branched or cyclic alkyl group of 1 to 10 carbon atoms, $R^{57}$ is a single bond, an oxygen atom or an alkylene group of 1 to 4 carbon atoms, and u is an integer of 1 to 20.

In an alternative embodiment, the recurring units containing silicon have the general formula (18).

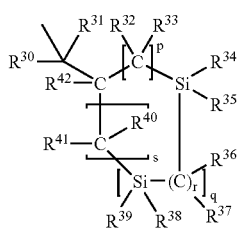
(14)

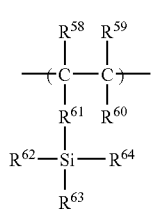
(18)

wherein each of $R^{29}$, $R^{30}$ and $R^{31}$ is a straight, branched or cyclic alkyl group of 1 to 20 carbon atoms, each of $R^{19}$, $R^{20}$, $R^{23}$, $R^{24}$, $R^{27}$, $R^{28}$, $R^{32}$, $R^{33}$, $R^{36}$, $R^{37}$, $R^{40}$, $R^{41}$ and $R^{42}$ is hydrogen or a straight, branched or cyclic alkyl group of 1 to 20 carbon atoms, each of $R^{21}$, $R^{22}$, $R^{25}$, $R^{26}$, $R^{34}$, $R^{35}$, $R^{38}$ and $R^{39}$ is hydrogen, a straight, branched or cyclic alkyl group of 1 to 20 carbon atoms, a straight, branched or cyclic fluorinated alkyl group of 1 to 20 carbon atoms, or an aryl group of 6 to 20 carbon atoms, p, q, r and s each are an integer of 0 to 10, satisfying $1 \leq p+q+s \leq 20$, Herein each of $R^{58}$, $R^{59}$ and $R^{60}$ is hydrogen or a straight, branched or cyclic alkyl group of 1 to 10 carbon atoms, $R^{61}$ is a single bond or a straight, branched or cyclic alkylene group of 1 to 10 carbon atoms, each of $R^{62}$, $R^{63}$ and $R^{64}$ is independently a straight, branched or cyclic alkyl or haloalkyl group of 1 to 20 carbon atoms, an aryl group of 6 to 20 carbon atoms, a trialkylsilyl group, or a silicon-containing group which forms a siloxane or silalkylene bond with the silicon atom in each formula, or $R^{62}$ and $R^{63}$, $R^{62}$ and $R^{64}$, or $R^{63}$ and $R^{64}$, taken together, may form a polysiloxane ring with the silicon atom to which they are attached.

In a second aspect, the present invention provides a resist composition comprising the polymer as set forth above, specifically a chemically amplified positive resist composition comprising (A) the polymer as set forth above, (B) a photoacid generator, (C) an organic solvent, and optionally, (D) a dissolution inhibitor. The chemically amplified positive resist composition may further comprise (E) a basic compound.

In a third aspect, the present invention provides a process for forming a resist pattern comprising the steps of (i) applying the chemically amplified positive resist composition defined above onto a substrate to form a coating, (ii) heat treating the coating and then exposing it to high energy radiation having a wavelength of up to 300 nm or electron beam through a photomask, and (iii) optionally heat treating the exposed coating and developing it with a developer to form a resist pattern.

In a preferred embodiment wherein the substrate bears thereon an underlay on which the coating of the resist composition is formed, the process further comprises the step of treating the underlay by an etching process including oxygen plasma etching, after the resist pattern formation, or the step of treating the underlay by etching with a halogen gas containing chlorine or bromine, after the resist pattern formation.

The resist composition comprising a polymer including recurring siliceous units and recurring units having a specific substituent group as a base resin according to the invention is sensitive to high-energy radiation, and has excellent sensitivity and resolution at a wavelength of less than 300 nm as well as satisfactory oxygen plasma etching resistance. These features of the inventive resist composition enable its use particularly in the two-layer resist technology, and permit a finely defined pattern having sidewalls perpendicular to the substrate to be easily be formed, making the resist ideal as a micropatterning material in VLSI fabrication.

DESCRIPTION OF THE PREFERRED EMBODIMENTS

Polymer

Figure 1A:
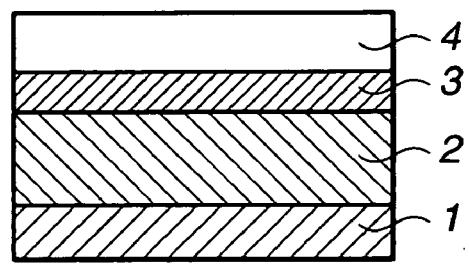
FIG. 1 schematically illustrates a layer structure patterning process involving oxygen etching.

The high molecular weight compound or polymer of the invention is defined as comprising recurring units containing silicon and recurring units having a substituent group of the general formula (1), (2) or (3).

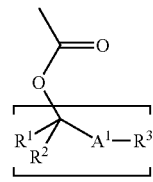

(1)

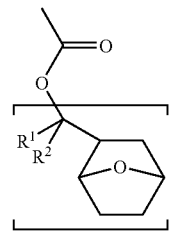

(2)

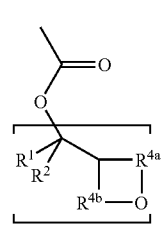

(3)

In formulae (1) to (3), $A^1$ is a divalent group selected from furandiyl, tetrahydrofurandiyl and oxanorbornanediyl. $R^1$ and $R^2$ are independently selected from straight, branched or cyclic monovalent hydrocarbon groups of 1 to 10 carbon atoms, especially 1 to 8 carbon atoms. Alternatively, $R^1$ and $R^2$ taken together may form an aliphatic hydrocarbon ring with the carbon atom to which they are attached. $R^3$ is hydrogen or a straight, branched or cyclic monovalent hydrocarbon group of 1 to 10 carbon atoms, especially 1 to 8 carbon atoms, which may contain a hetero atom. $R^{4a}$ and $R^{4b}$ each are a single bond or an alkylene or alkenylene group of 1 to 4 carbon atoms, with the proviso that the total number of carbon atoms in $R^{4a}$ and $R^{4b}$ is from 3 to 6.

Suitable monovalent hydrocarbon groups of 1 to 10 carbon atoms represented by $R^1$ and $R^2$ include straight, branched or cyclic alkyl groups such as methyl, ethyl, propyl, isopropyl, butyl, isobutyl, tert-butyl, pentyl, cyclopentyl, hexyl, cyclohexyl, octyl, decyl, norbornyl and adamantyl. Suitable aliphatic hydrocarbon rings that $R^1$ and $R^2$ form with the carbon atom to which they are attached include divalent single rings having 3 to 12 carbon atoms, especially 3 to 10 carbon atoms, such as cycloalkylene and norbornylene groups.

Suitable monovalent hydrocarbon groups of 1 to 10 carbon atoms which may contain a hetero atom, represented by $R^3$, include straight, branched or cyclic alkyl groups and substituted ones thereof in which one or more hydrogen atoms are substituted with hydroxyl groups, alkoxy groups (e.g., methoxy, ethoxy), acyl groups (e.g., acetoxy) or the like.

Of the recurring units having a substituent group of the general formula (1), (2) or (3), preferred are recurring units of the following general formulae (4) to (8).

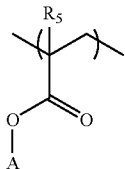
(4)

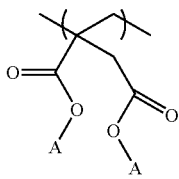
(5)

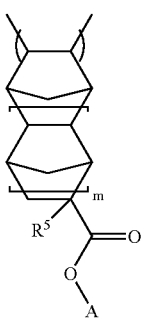
(6)

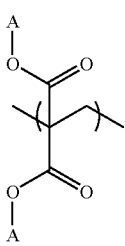
(7)

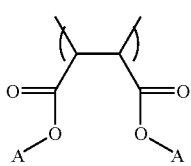
(8)

Herein $R^5$ is hydrogen or methyl, and m is 0 or 1. "A" is a group selected from the following formulae (1a), (2a) and (3a), and a plurality of A's may be the same or different.

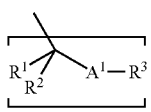
(1a)

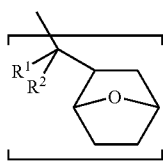
(2a)

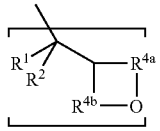
(3a)

Herein $A^1$, $R^1$ to $R^3$, $R^{4a}$ and $R^{4b}$ are as defined above.

The recurring units of formulae (4) to (8) are derived from corresponding monomers, respectively. The monomers used herein are characterized by including a 7-oxonorbornane, tetrahydrofuran or tetrahydropyran skeleton.

In particular, 7-oxonorbornane is extraordinarily hydrophilic with a significant difference from norbornane. It is presumed that on account of steric strain exerted at the 7-position corresponding to the bridgehead, the lone pair of the oxygen atom is oriented outward of the ring to enhance polarity whereby hydrophilicity is enhanced.

Examples of the monomers from which recurring units of formulae (4) to (8) are derived are shown below. In the formulae below, Me is methyl and Ac is acetyl.

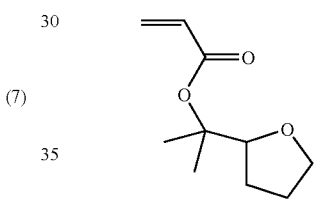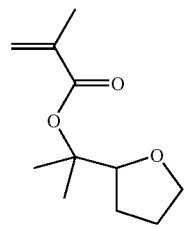

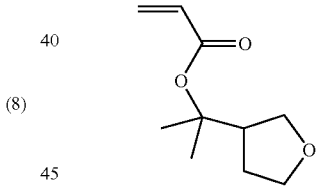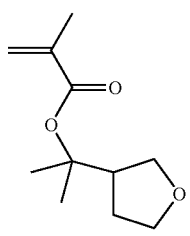

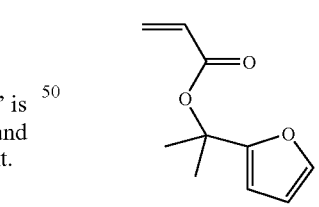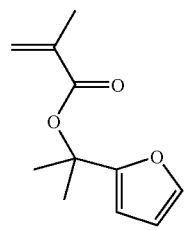

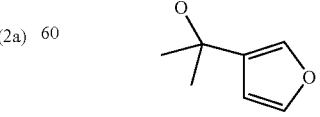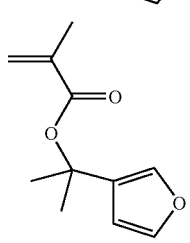

-continued
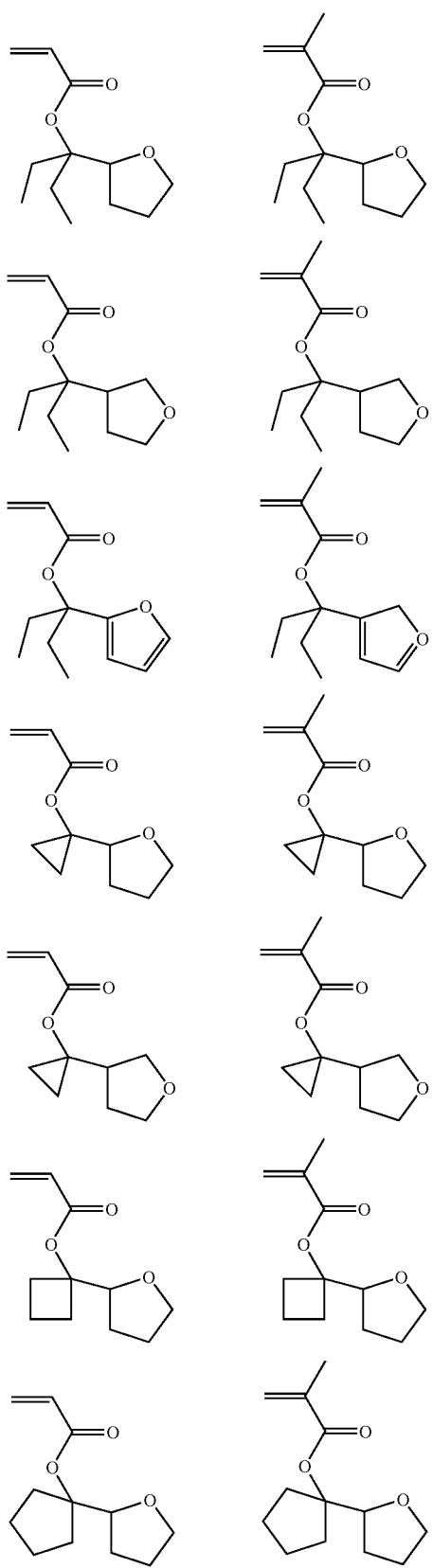
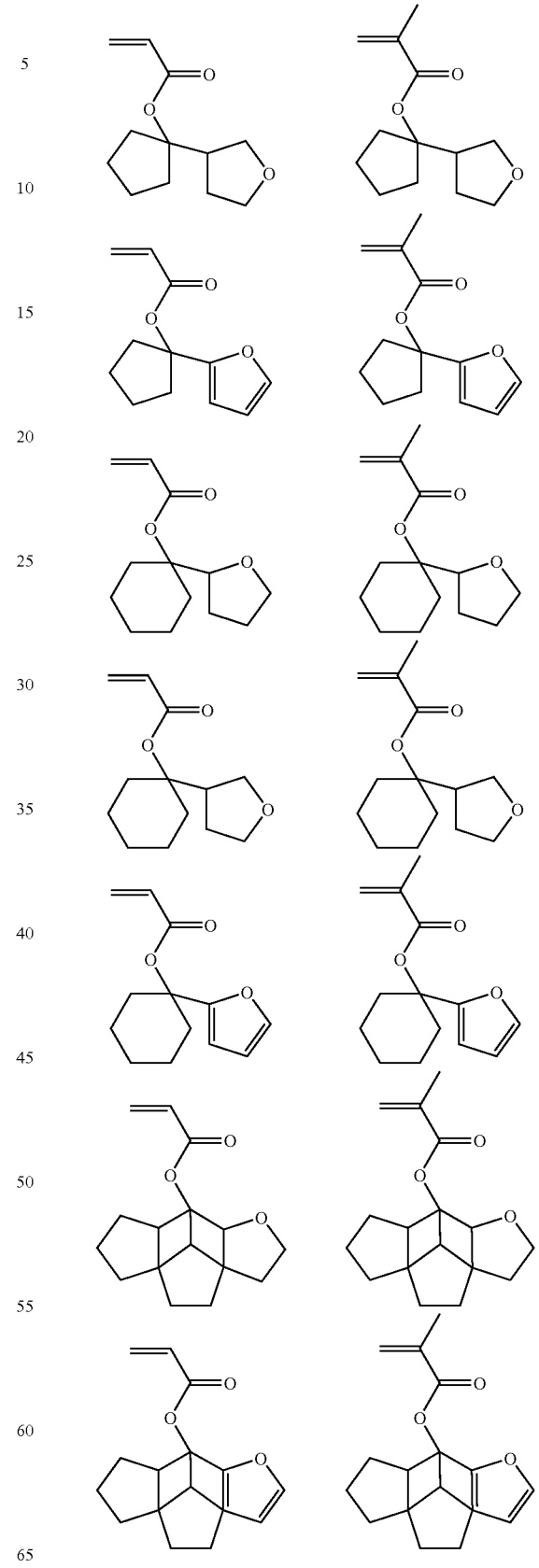

-continued
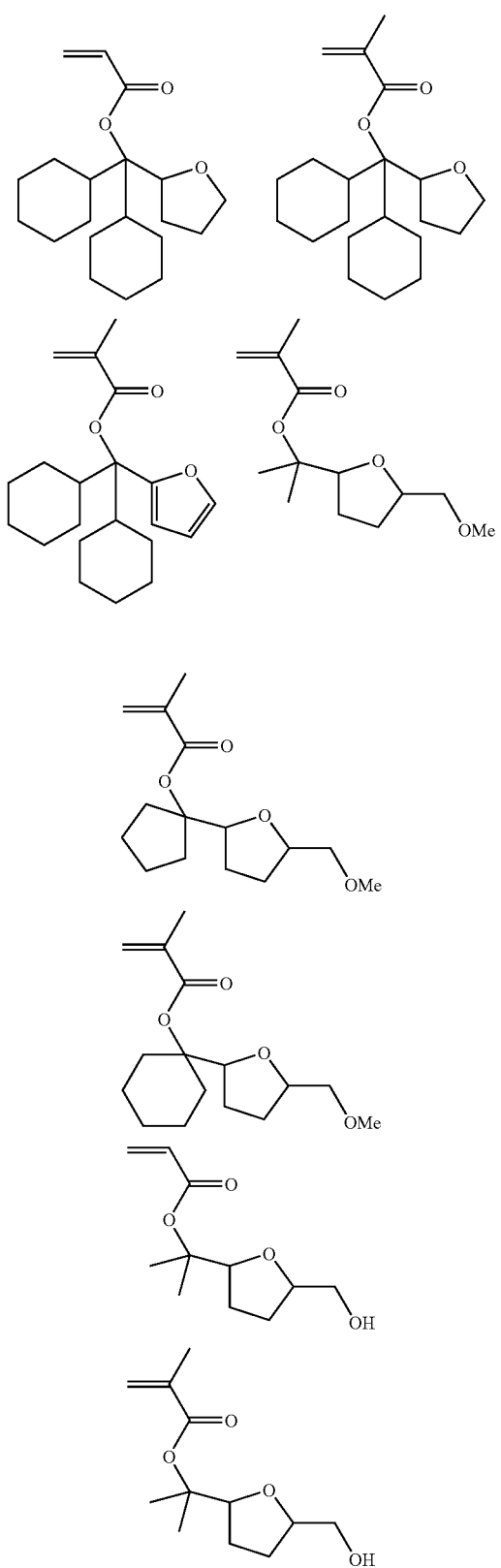
-continued
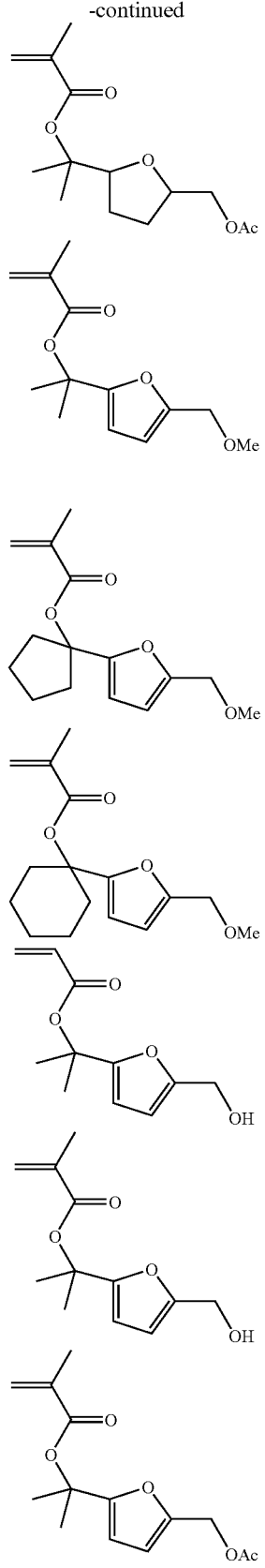

-continued
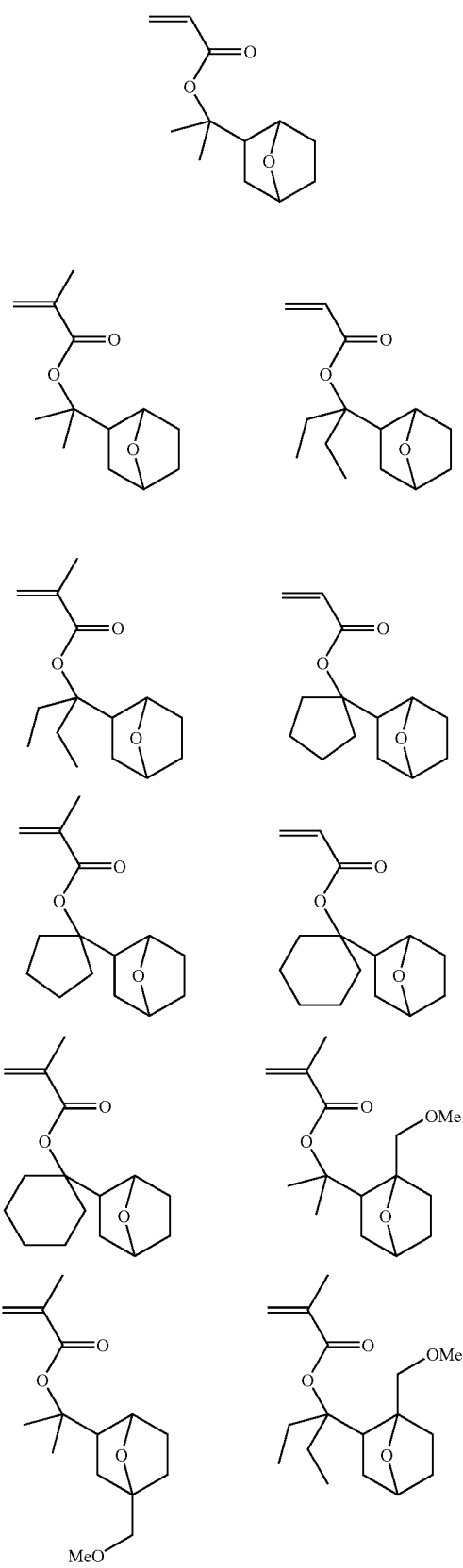
-continued
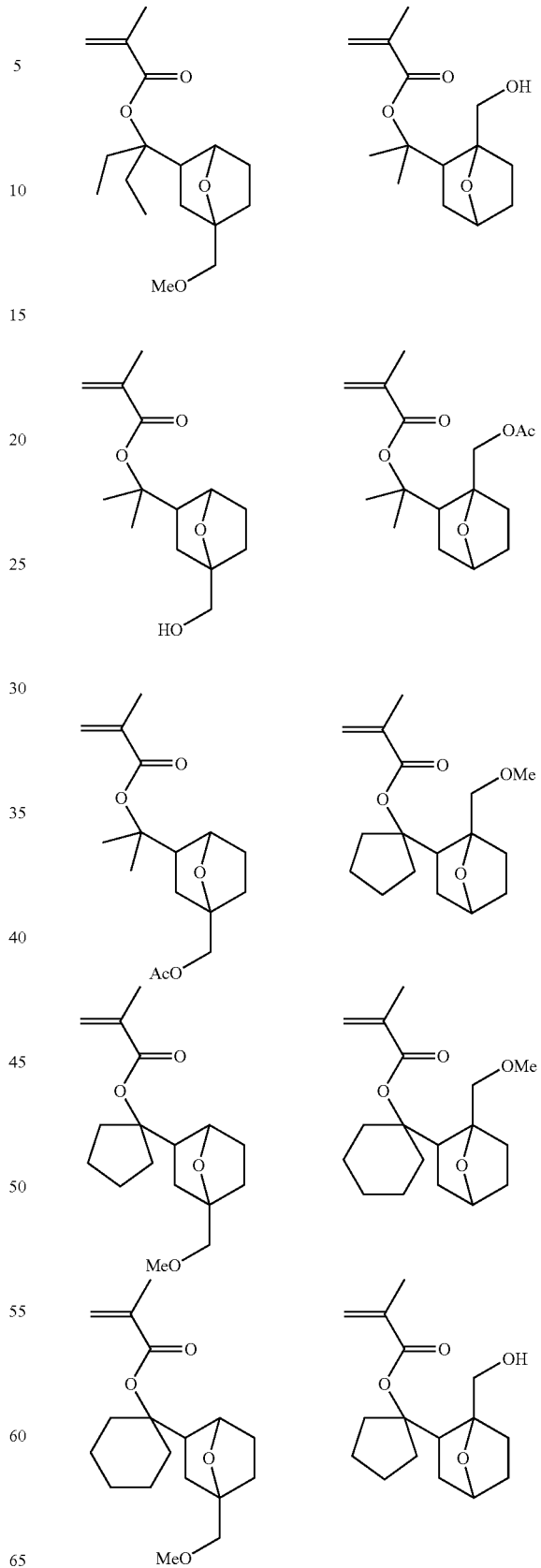

-continued
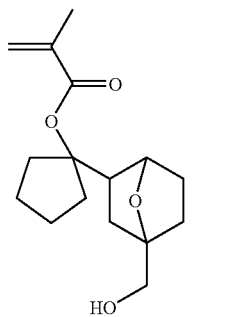 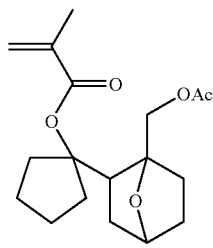
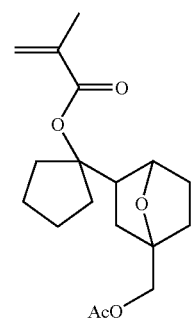 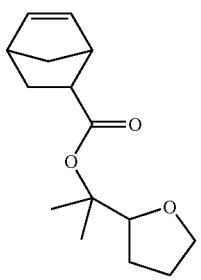
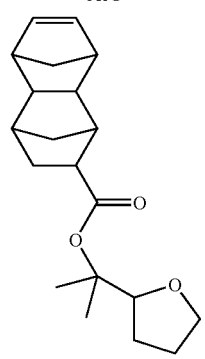 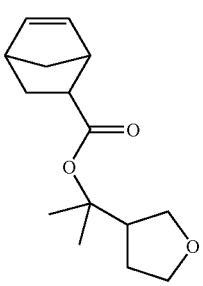
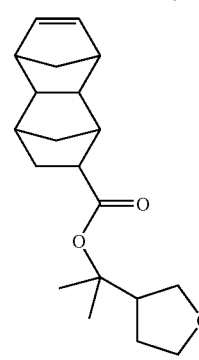 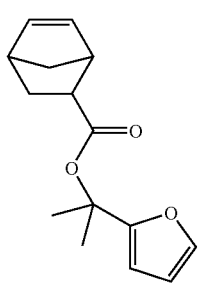
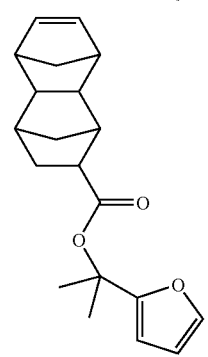 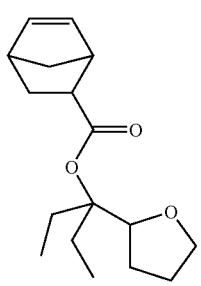
-continued
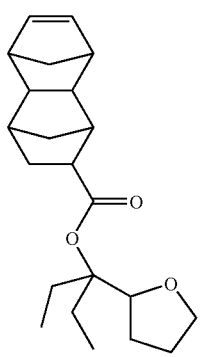 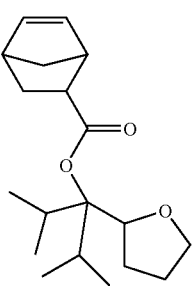
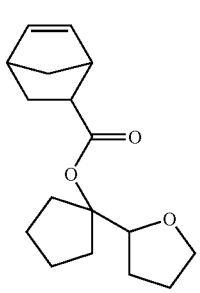 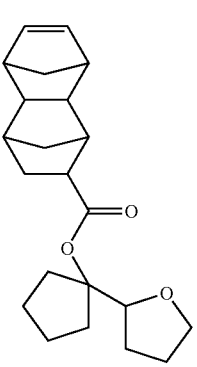
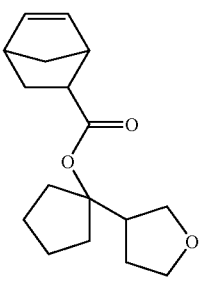 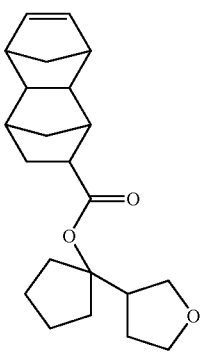
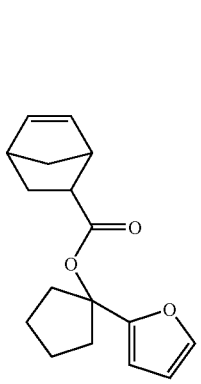 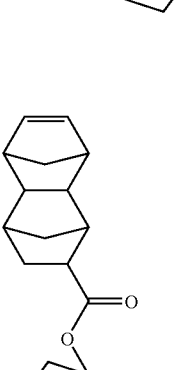

-continued
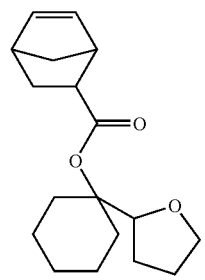
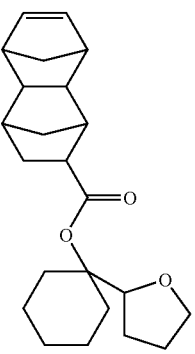
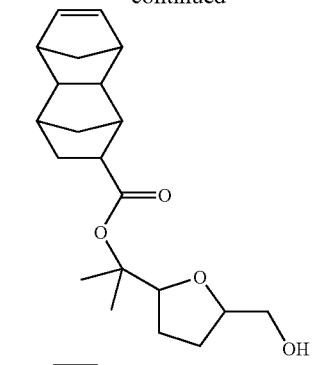
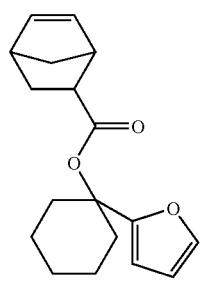
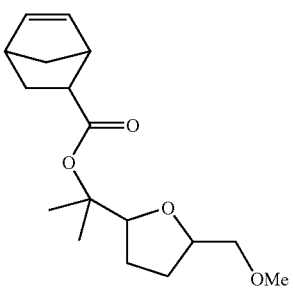
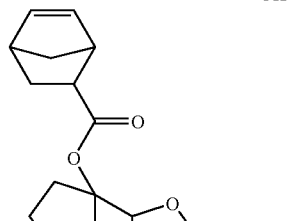
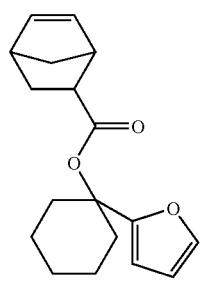
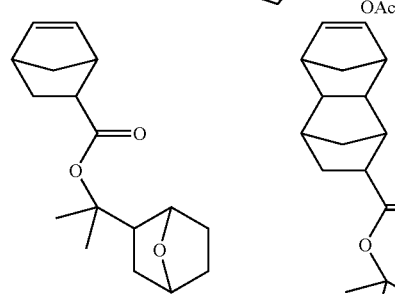
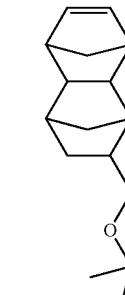
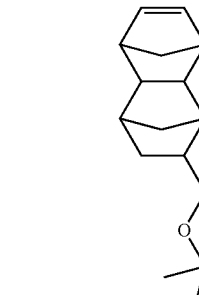
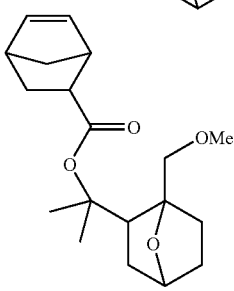

-continued

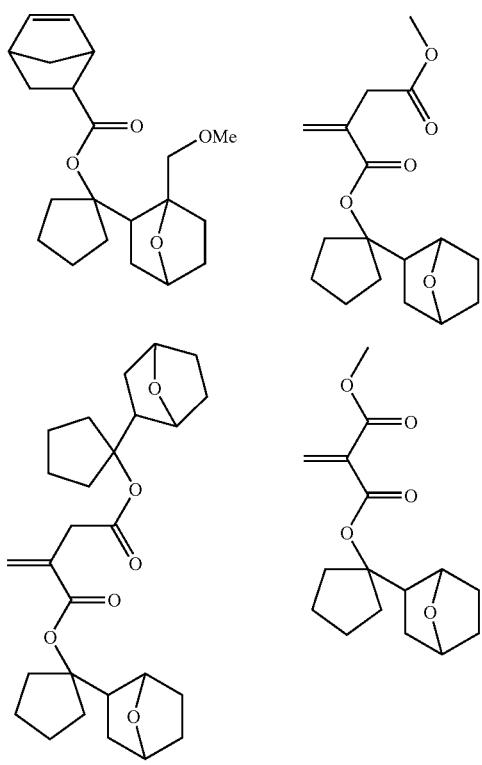

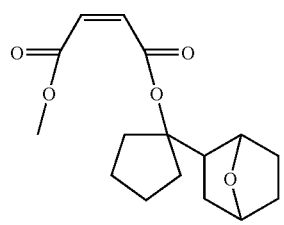

LogP, a partition coefficient of n-octanol/water is used as a solubility parameter of a given material. It is a ratio in maximum dissolution concentration of octanol to water. Professor Hansch at Pomona College first announced that LogP is a crucial parameter for pharmaceuticals. Since then, LogP values of numerous materials have been measured.

On the other hand, cLogP for calculating LogP from a chemical structural formula using a substituent constant π was developed by Dr. Leo who studied with Professor Hansch. The software of cLogP is commercially available from Daylight Chemical Information Systems, Inc. The cLogP is known as a convenient method for prediction of LogP values through calculations.

Shown below are the results of calculation using the software pcmodels, version 4.7.2, by Daylight Chemical Information Systems, Inc.

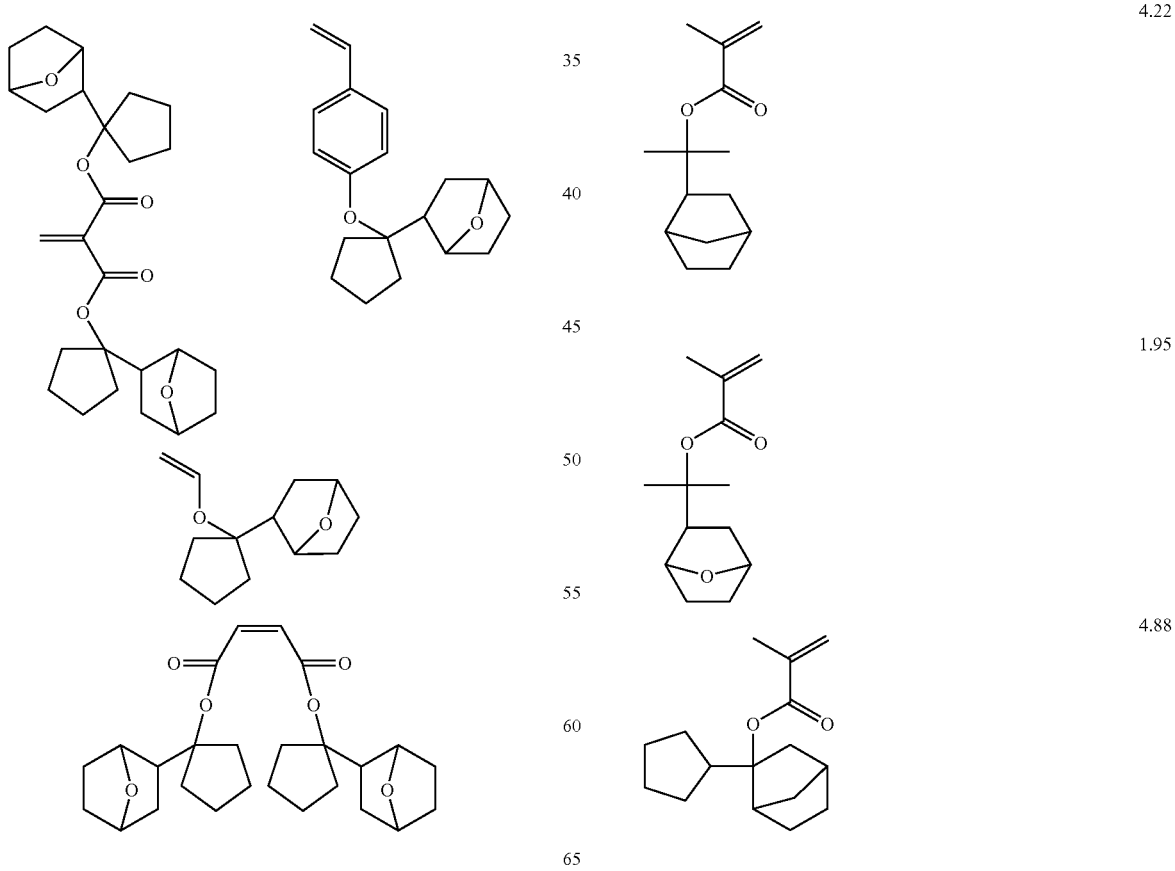

-continued 3.22

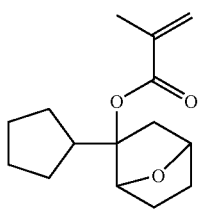

Lower values of LogP or cLogP indicate higher solubility in water and higher hydrophilicity. The results prove the hydrophilicity enhancement of 7-oxonorbornane ring.

Of the recurring units containing silicon, preferred are recurring units of the following general formula (9) or (18).

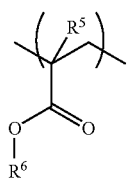
(9)

Herein $R^5$ is hydrogen or methyl, and $R^6$ is a silicon-containing group selected from the following general formulae (10), (11), (12), (13), (14), (15) and (16).

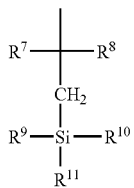
(10)

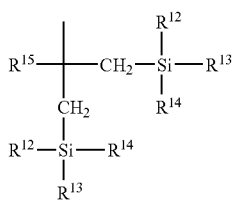
(11)

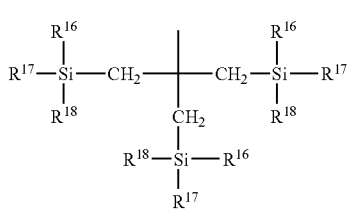
(12)

Herein each of $R^7$, $R^8$ and $R^{15}$ is hydrogen or a straight, branched or cyclic alkyl group of 1 to 10 carbon atoms, especially 1 to 8 carbon atoms. Each of $R^9$, $R^{10}$, $R^{11}$, $R^{12}$, $R^{13}$, $R^{14}$, $R^{16}$, $R^{17}$ and $R^{18}$ is a straight, branched or cyclic alkyl group of 1 to 10 carbon atoms, especially 1 to 8 carbon atoms, an aryl group of 6 to 10 carbon atoms, a trialkylsilyl group, or a silicon-containing group which forms a siloxane or silalkylene bond with the silicon atom in each formula. Alternatively, $R^7$ and $R^8$ taken together may form an aliphatic hydrocarbon ring of 3 to 10 carbon atoms, especially 3 to 8 carbon atoms, with the carbon atom to which they are attached. Additionally, a pair of $R^9$ and $R^{10}$, a pair of $R^9$ and $R^{11}$, a pair of $R^{10}$ and $R^{11}$, a pair of $R^{12}$ and $R^{13}$, a pair of $R^{12}$ and $R^{14}$, a pair of $R^{13}$ and $R^{14}$, a pair of $R^{16}$ and $R^{17}$, a pair of $R^{16}$ and $R^{18}$, and a pair of $R^{17}$ and $R^{18}$, taken together, may form a polysiloxane ring of 3 to 10 silicon atoms, especially 4 to 8 silicon atoms, with the silicon atom to which they are attached.

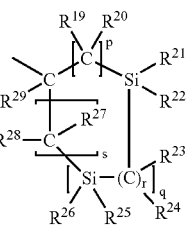
(13)

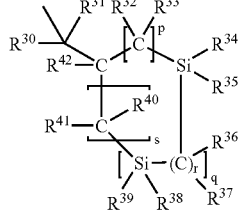
(14)

Herein each of $R^{29}$, $R^{30}$ and $R^{31}$ is a straight, branched or cyclic alkyl group of 1 to 20 carbon atoms, especially 1 to 6 carbon atoms. Each of $R^{19}$, $R^{20}$, $R^{23}$, $R^{24}$, $R^{27}$, $R^{28}$, $R^{32}$, $R^{33}$, $R^{36}$, $R^{37}$, $R^{40}$, $R^{41}$ and $R^{42}$ is hydrogen or a straight, branched or cyclic alkyl group of 1 to 20 carbon atoms. Each of $R^{21}$, $R^{22}$, $R^{25}$, $R^{26}$, $R^{34}$, $R^{35}$, $R^{38}$ and $R^{39}$ is hydrogen, a straight, branched or cyclic alkyl group of 1 to 20 carbon atoms, especially 1 to 10 carbon atoms, a straight, branched or cyclic fluorinated alkyl group of 1 to 20 carbon atoms, especially 1 to 10 carbon atoms, or an aryl group of 6 to 20 carbon atoms, especially 6 to 10 carbon atoms, p, q, r and s each are an integer of 0 to 10, especially 0 to 8, satisfying $1 \leq p+q+s \leq 20$, especially $1 \leq p+q+s \leq 10$.

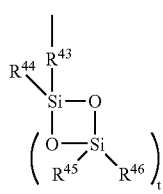
(15)

Herein $R^{43}$ is an alkylene group of 2 to 4 carbon atoms, each of $R^{44}$, $R^{45}$ and $R^{46}$ is a straight, branched or cyclic alkyl group of 1 to 10 carbon atoms, especially 1 to 6 carbon atoms, or an aryl group of 6 to 10 carbon atoms, and t is an integer of 2 to 10, especially 2 to 6.

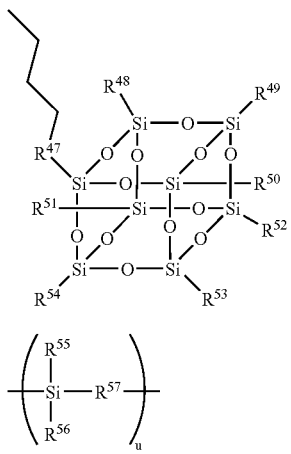
(16)

(17)

Herein each of $R^{48}$ to $R^{54}$ is independently hydrogen or a straight, branched or cyclic alkyl or fluorinated alkyl group of 1 to 10 carbon atoms, especially 1 to 8 carbon atoms, which may contain an ether, lactone, ester, hydroxy or cyano group. $R^{47}$ is a single bond or a linking group of formula (17). $R^{55}$ and $R^{56}$ each are a straight, branched or cyclic alkyl group of 1 to 10 carbon atoms, especially 1 to 8 carbon atoms. $R^{57}$ is a single bond, an oxygen atom or an alkylene group of 1 to 4 carbon atoms. The letter u is an integer of 1 to 20, especially 1 to 10.

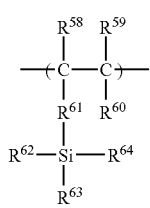
(18)

Herein each of $R^{58}$, $R^{59}$ and $R^{60}$ is hydrogen or a straight, branched or cyclic alkyl group of 1 to 10 carbon atoms, especially 1 to 4 carbon atoms. $R^{61}$ is a single bond or a straight, branched or cyclic alkylene group of 1 to 10 carbon atoms, especially 1 to 4 carbon atoms. Each of $R^{62}$, $R^{63}$ and $R^{64}$ is independently a straight, branched or cyclic alkyl or halo-alkyl group of 1 to 20 carbon atoms, especially 1 to 10 carbon atoms, an aryl group of 6 to 20 carbon atoms, especially 6 to 10 carbon atoms, a trialkylsilyl group, or a silicon-containing group which forms a siloxane or silalkylene bond with the silicon atom in each formula. Alternatively, $R^{62}$ and $R^{63}$, $R^{62}$ and $R^{64}$, or $R^{63}$ and $R^{64}$, taken together, may form a polysiloxane ring with the silicon atom to which they are attached.

Suitable alkyl groups include, but are not limited to, methyl, ethyl, propyl, isopropyl, butyl, isobutyl, tert-butyl, pentyl, cyclopentyl, hexyl, cyclohexyl, octyl, decyl, dodecyl, myristyl and stearyl. Suitable halo-alkyl groups, typically fluorinated alkyl groups include the foregoing alkyl groups in which some or all of the hydrogen atoms are substituted with halogen atoms, typically fluorine atoms. Suitable aryl groups include, but are not limited to, phenyl, tolyl, xylyl and naphthyl. Suitable alkylene groups include the foregoing alkyl groups with one hydrogen atom eliminated. In the trialkylsilyl group, each alkyl group has preferably 1 to 6 carbon atoms such as methyl group. Suitable trialkylsilyl groups include trimethylsilyl group.

Examples of the silicon-containing group which forms a siloxane or silalkylene bond with the silicon atom include groups of the formula:

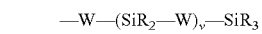

wherein W is O or $CH_2$, R is an alkyl group of 1 to 10 carbon atoms, especially 1 to 6 carbon atoms, or aryl group, and v is an integer of 0 to 10, especially 0 to 6. Examples of the trialkylsilyl group represented by $SiR_3$ include trimethylsilyl, triethylsilyl, and dimethyl-tert-butylsilyl.

Suitable polysiloxane rings include those of the formula:

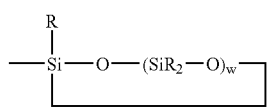

wherein R is as defined above and w is an integer of 2 to 10, especially 3 to 6.

It is understood that the silicon-containing groups of formulae (10), (11), (12), (13) and (14) serve as acid labile groups.

Illustrative examples of the silicon-containing groups of formulae (10), (11) and (12) include those of the following formulae (10)-1 to (10)-16, (11)-1 and (12)-1.

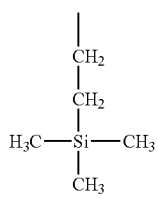
(10)-1

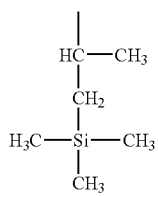
(10)-7

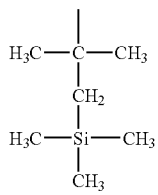
(10)-3

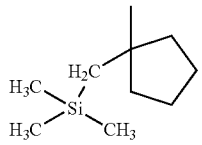
(10)-4

-continued
(10)-5
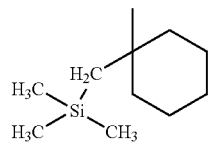
(10)-6
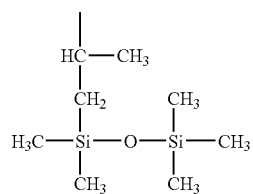
(10)-7
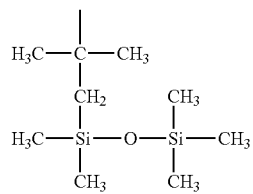
(10)-8
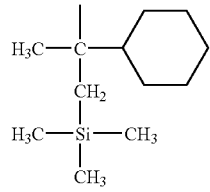
(10)-9
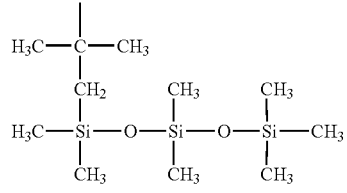
(10)-10
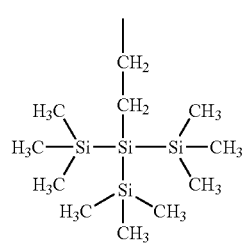
(10)-11
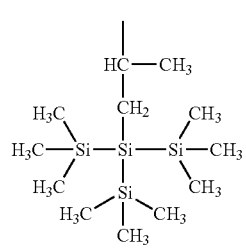
-continued
(10)-12
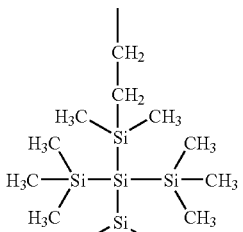
(10)-13
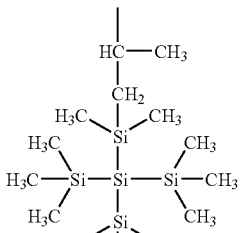
(10)-14
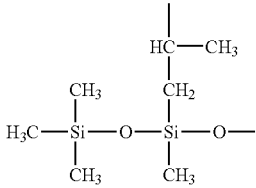
(10)-15
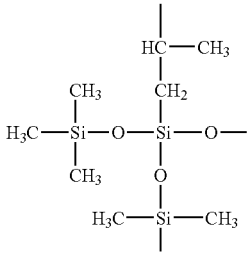
(10)-16
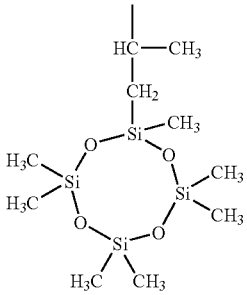
(11)-1
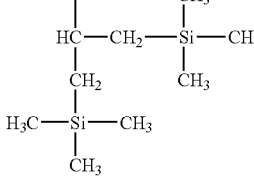

(12)-1
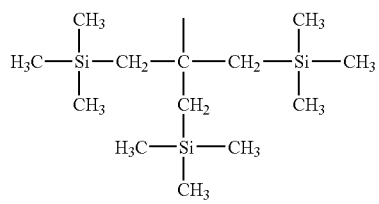
Illustrative examples of the cyclic silicon-containing acid labile groups of formulae (13) and (14) include those of the following formulae (13)-1 to (13)-6 and (14)-1 to (14)-6.
(13)-1
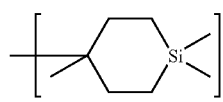
(13)-2
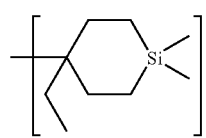
(13)-3
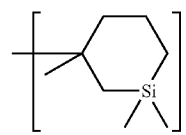
(13)-4
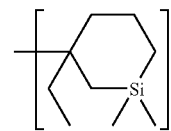
(13)-5
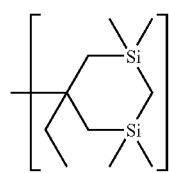
(13)-6
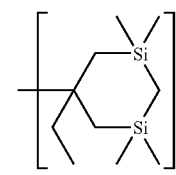
(14)-1
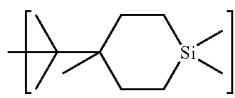
(14)-2
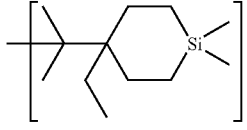
(14)-3
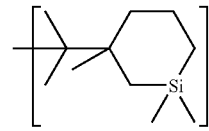
(14)-4
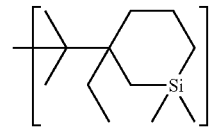
(14)-5
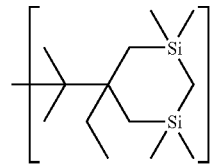
(14)-6
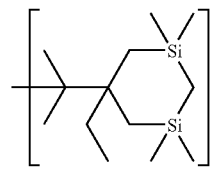
Illustrative examples of the silicon-containing groups of formula (15) include those of the following formulae (15)-1 to (15)-3.
(15)-1
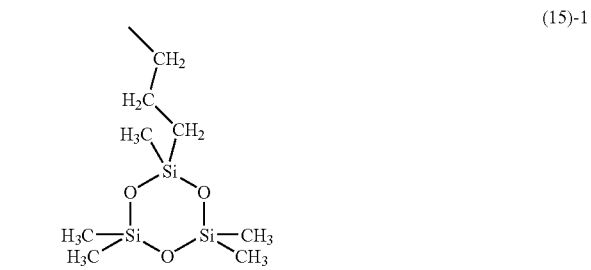
(15)-2
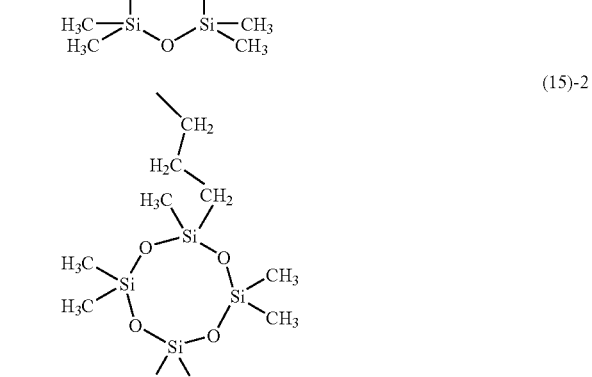

-continued
(15)-3
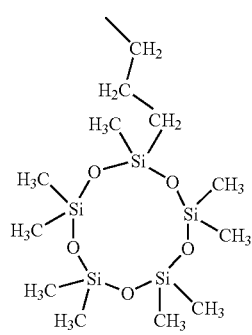
Illustrative examples of the silicon-containing groups of formula (16) include those of the following formulae (16)-1 to (16)-18.
(16)-1
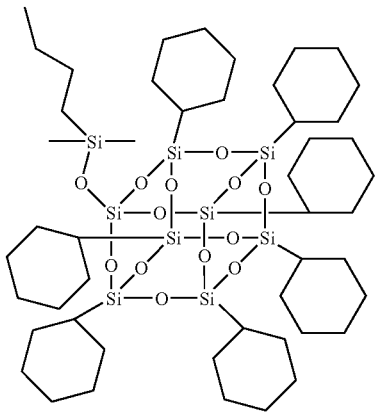
(16)-2
(16)-3
(16)-4
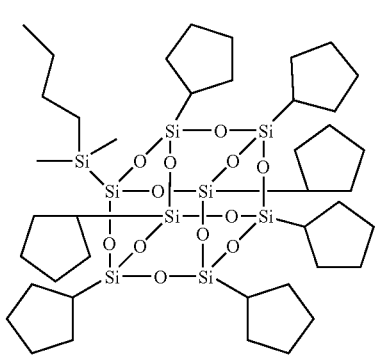
(16)-5
(16)-6
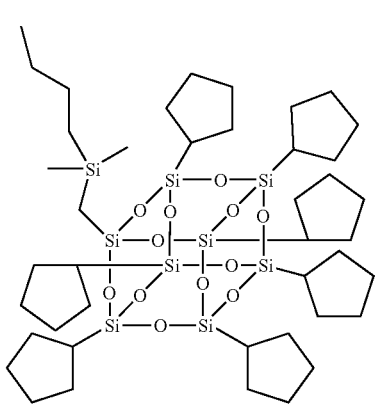
(16)-7
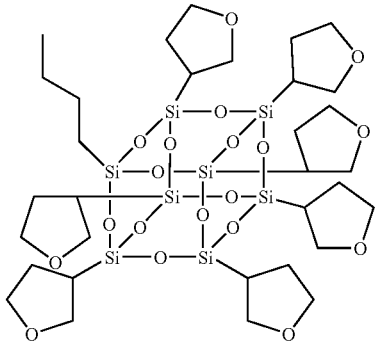

(16)-8
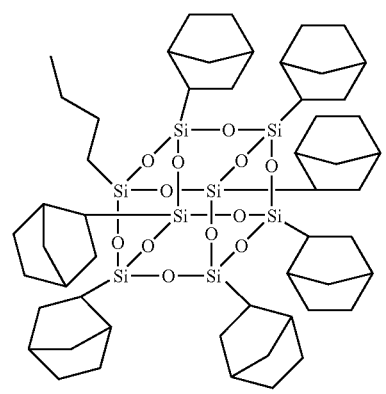
(16)-9
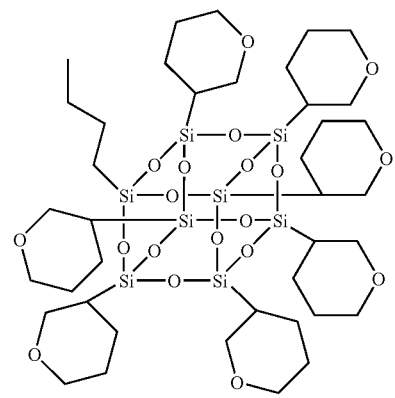
(16)-10
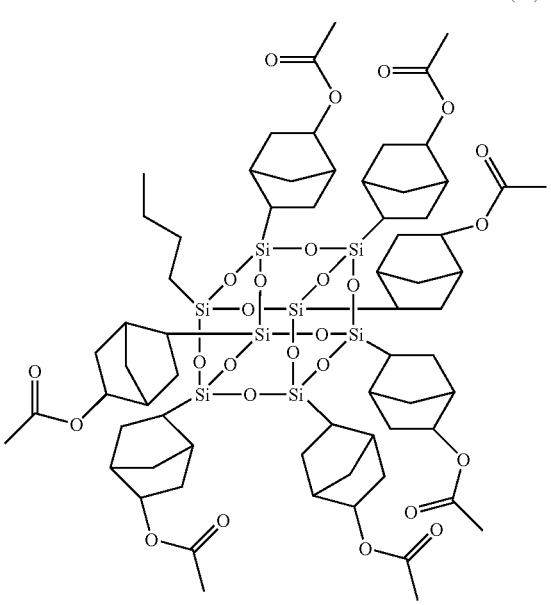
(16)-11
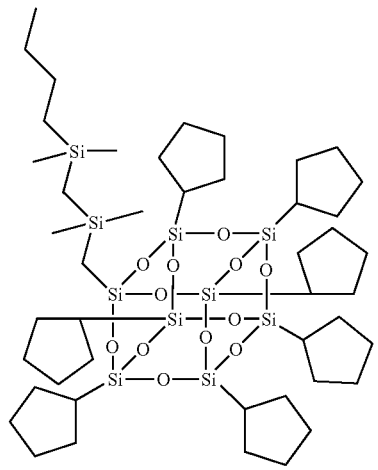
(16)-12
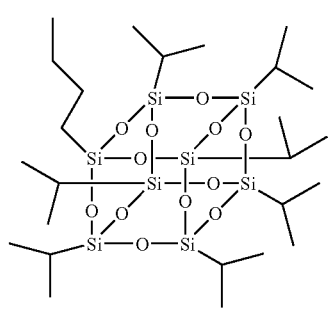
(16)-13
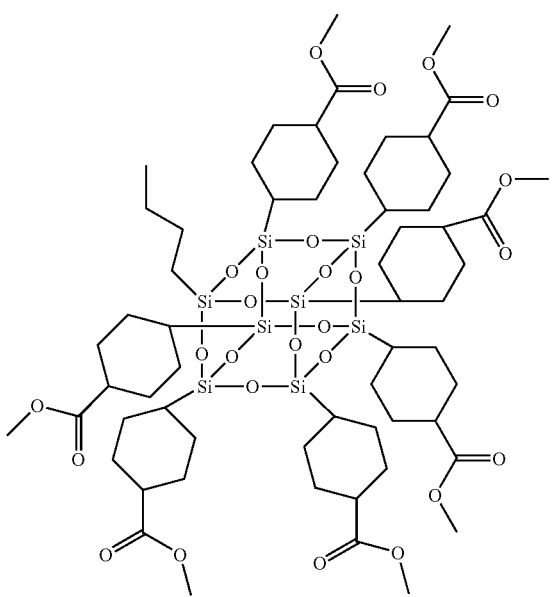

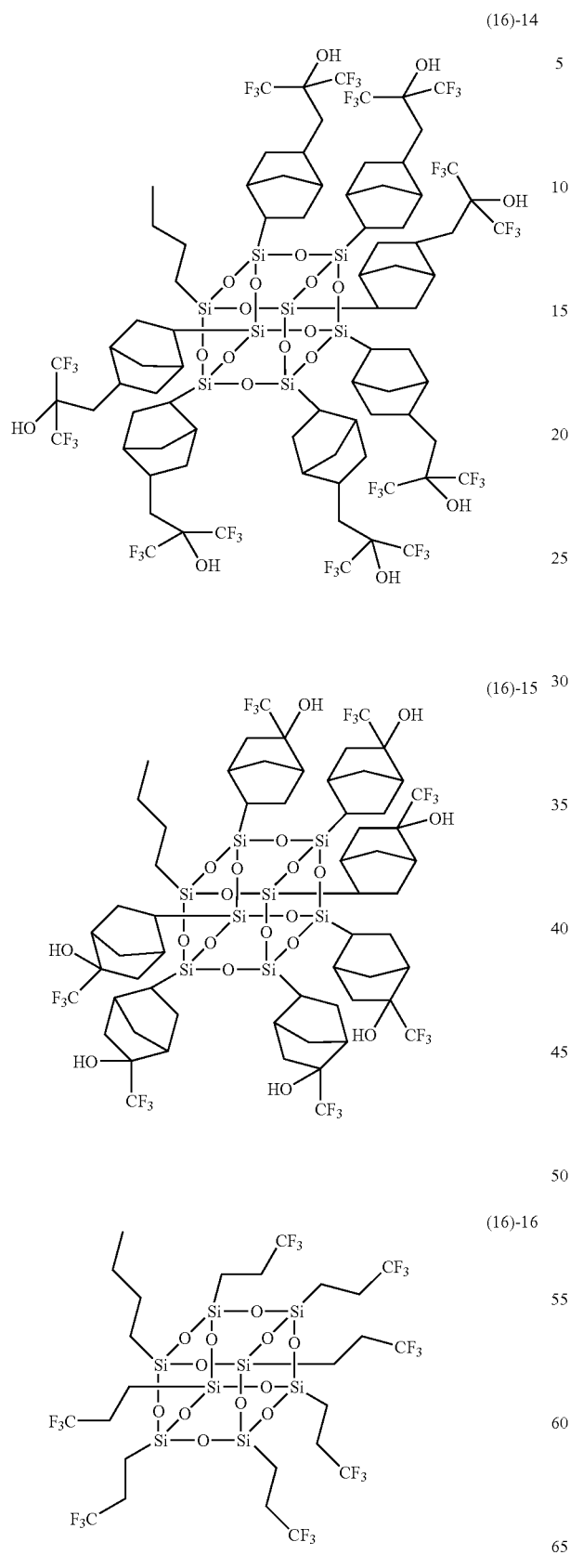
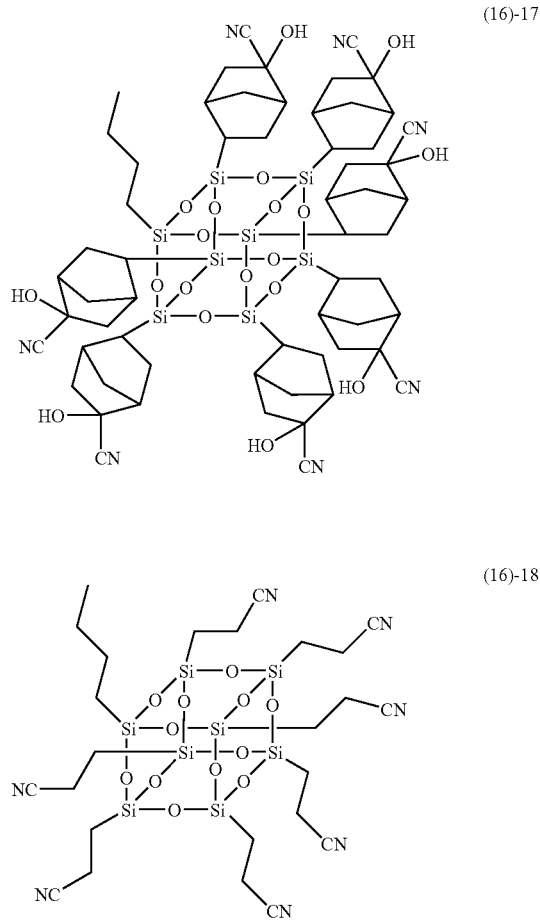
Illustrative examples of the silicon-containing recurring units of formula (18) include those of the following formulae (18)-1 to (18)-22.
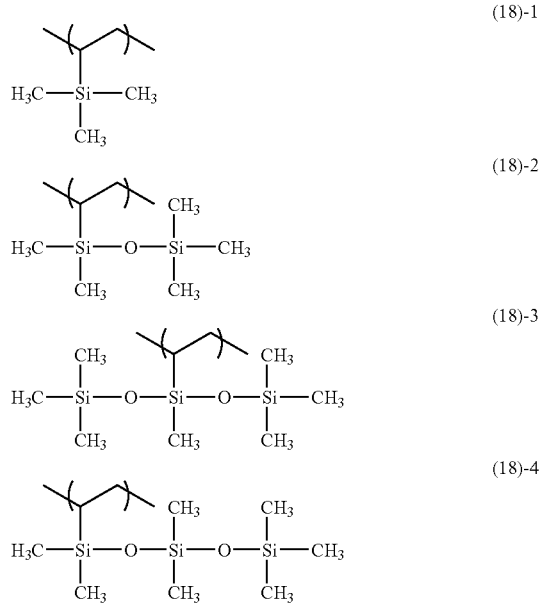

-continued
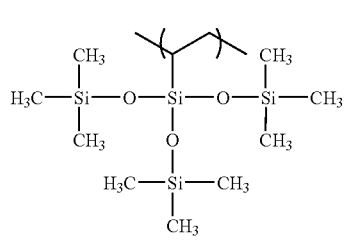 (18)-5
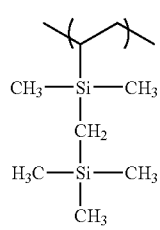 (18)-6
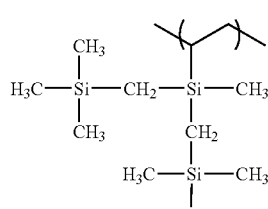 (18)-7
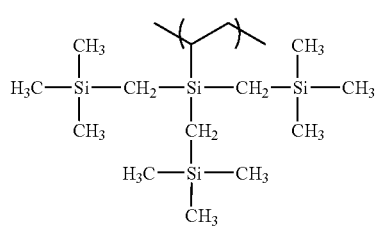 (18)-8
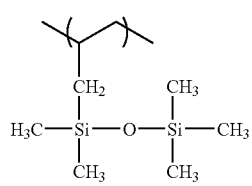 (18)-9
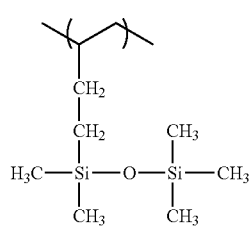 (18)-10
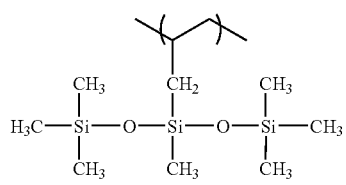 (18)-11
-continued
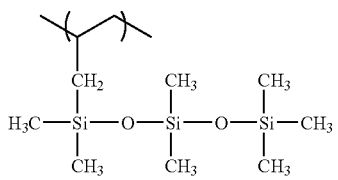 (18)-12
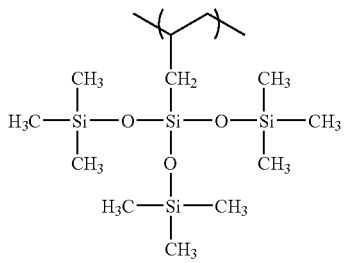 (18)-13
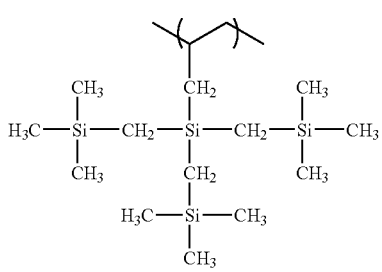 (18)-14
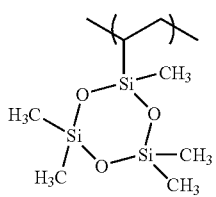 (18)-15
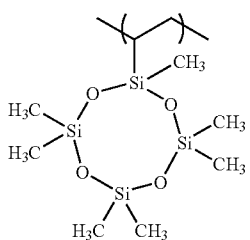 (18)-16
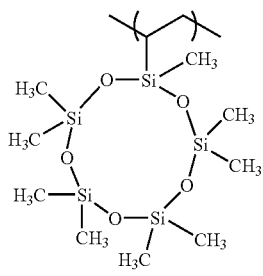 (18)-17

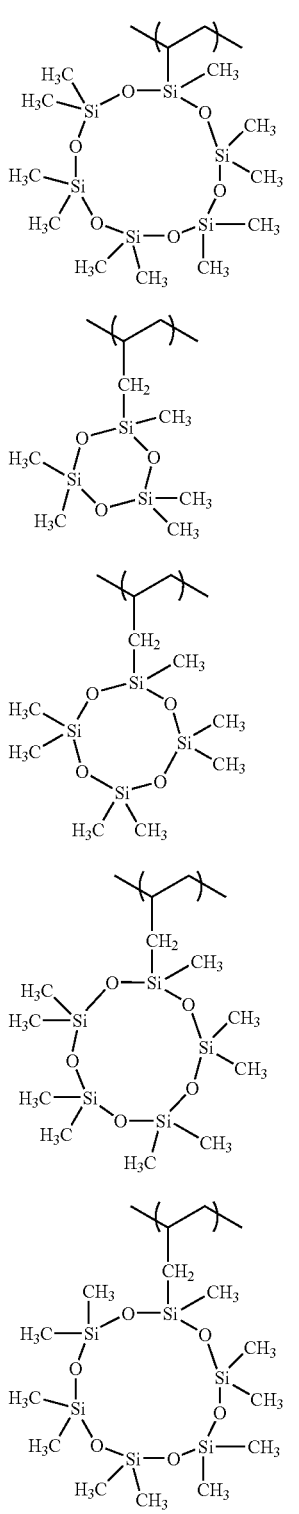

polymer may further have copolymerized therewith an ordinary monomer having an acid labile group, especially a monomer of (meth)acrylic acid, itaconic acid, fumaric acid, norbornene carboxylate or hydroxystyrene in which the hydrogen atom of a hydroxyl group is substituted with an acid labile group.

The acid labile group which can be used herein is selected from a variety of such groups, especially those groups of the general formulae (A-1), (A-2) and (A-3) below.

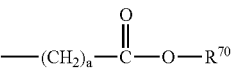 (A-1)

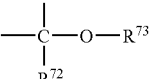 (A-2)

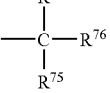 (A-3)

In formula (A-1), $R^{70}$ is a tertiary alkyl group having 4 to 20 carbon atoms, preferably 4 to 15 carbon atoms, a trialkylsilyl group in which each alkyl moiety has 1 to 6 carbon atoms, an oxoalkyl group having 4 to 20 carbon atoms, or a group of formula (A-3). Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable trialkylsilyl groups include trimethylsilyl, triethylsilyl, and dimethyl-tert-butylsilyl. Suitable oxoalkyl groups include 3-oxocyclohexyl, 4-methyl-2-oxooxan-4-yl, and 5-methyl-2-oxooxolan-5-yl. The subscript "a" is an integer of 0 to 6.

In formula (A-2), each of $R^{71}$ and $R^{72}$ is a hydrogen atom or a straight, branched or cyclic alkyl group of 1 to 18 carbon atoms, preferably 1 to 10 carbon atoms, such as methyl, ethyl, propyl, isopropyl, n-butyl, sec-butyl, tert-butyl, cyclopentyl, cyclohexyl, 2-ethylhexyl and n-octyl. $R^{73}$ is selected from monovalent hydrocarbon groups of 1 to 18 carbon atoms, preferably 1 to 10 carbon atoms, which may contain a hetero atom such as oxygen atom, for example, straight, branched or cyclic alkyl groups, and substituted alkyl groups in which some hydrogen atoms are substituted with hydroxyl, alkoxy, oxo, amino or alkylamino groups. Illustrative examples of substituted alkyl groups are shown below.

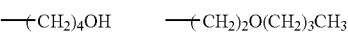

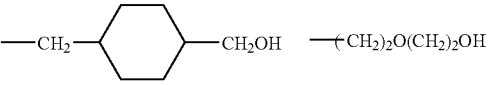

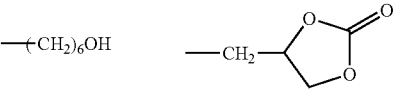

A pair of $R^{71}$ and $R^{72}$, $R^{71}$ and $R^{73}$, or $R^{72}$ and $R^{73}$ may form a ring. Each of $R^{71}$, $R^{72}$ and $R^{73}$ is a straight or branched alkylene group of 1 to 18 carbon atoms, preferably 1 to 10 carbon atoms, when they form a ring.

The polymer to be compounded as a base resin in the inventive resist composition is obtained by copolymerization of a monomer having an acid eliminatable group of the general formula (1) to (3) with a (meth)acrylic monomer having a silicon-containing pendant group or a vinylsilane or allylsilane derivative. In addition to these monomers, the Illustrative, non-limiting, examples of the acid labile group of formula (A-1) include
tert-butoxycarbonyl,
tert-butoxycarbonylmethyl,
tert-amyloxycarbonyl,
tert-amyloxycarbonylmethyl,
1,1-diethylpropyloxycarbonyl,
1,1-diethylpropyloxycarbonylmethyl,
1-ethylcyclopentyloxycarbonyl,
1-ethylcyclopentyloxycarbonylmethyl,
1-ethyl-2-cyclopentenyloxycarbonyl,
1-ethyl-2-cyclopentenyloxycarbonylmethyl,
1-ethoxyethoxycarbonylmethyl,
2-tetrahydropyranyloxycarbonylmethyl, and
2-tetrahydrofuranyloxycarbonylmethyl groups.

Also included are substituent groups of formulae (A-1)-1 to (A-1)-9 below.

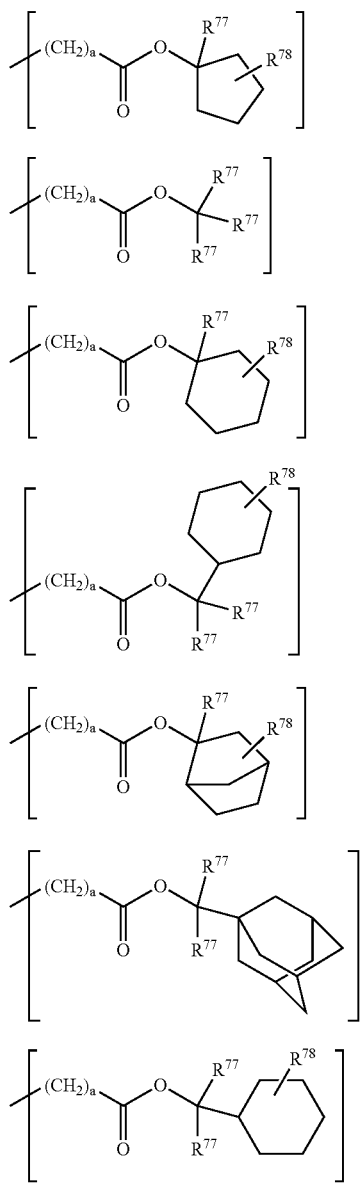

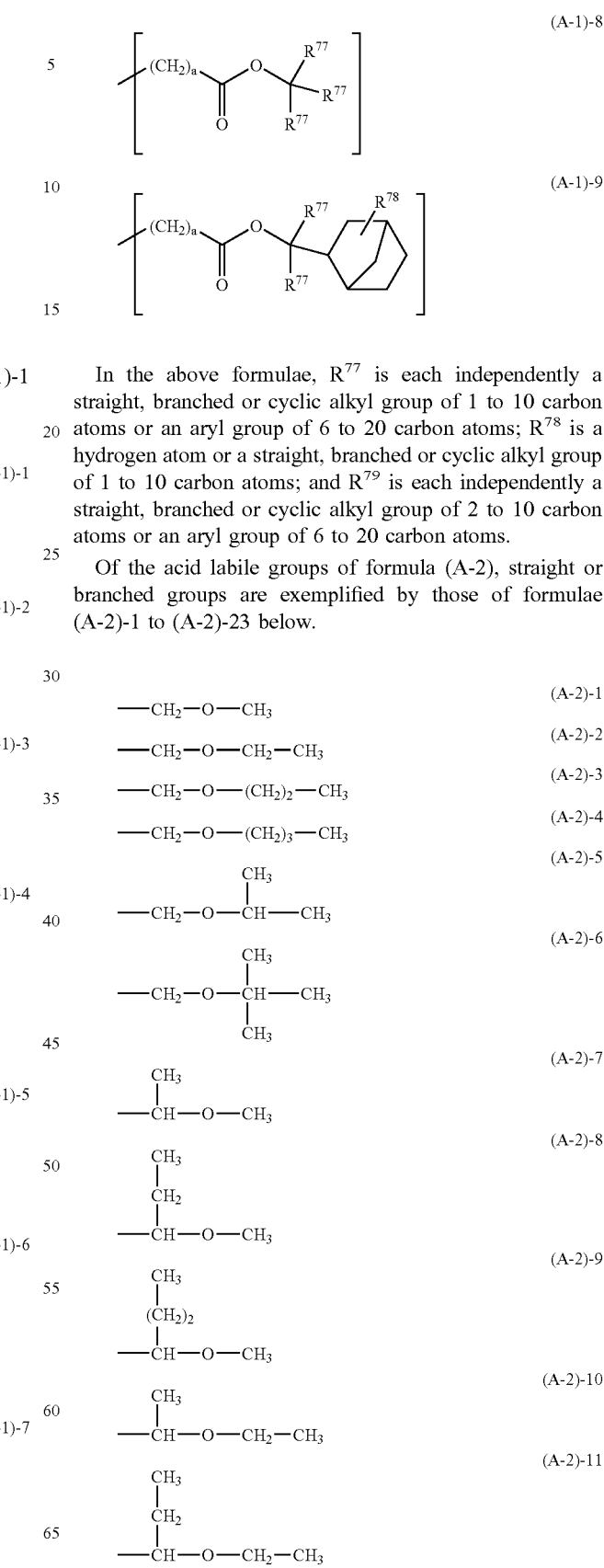

In the above formulae, $R^{77}$ is each independently a straight, branched or cyclic alkyl group of 1 to 10 carbon atoms or an aryl group of 6 to 20 carbon atoms; $R^{78}$ is a hydrogen atom or a straight, branched or cyclic alkyl group of 1 to 10 carbon atoms; and $R^{79}$ is each independently a straight, branched or cyclic alkyl group of 2 to 10 carbon atoms or an aryl group of 6 to 20 carbon atoms.

Of the acid labile groups of formula (A-2), straight or branched groups are exemplified by those of formulae (A-2)-1 to (A-2)-23 below.

-continued

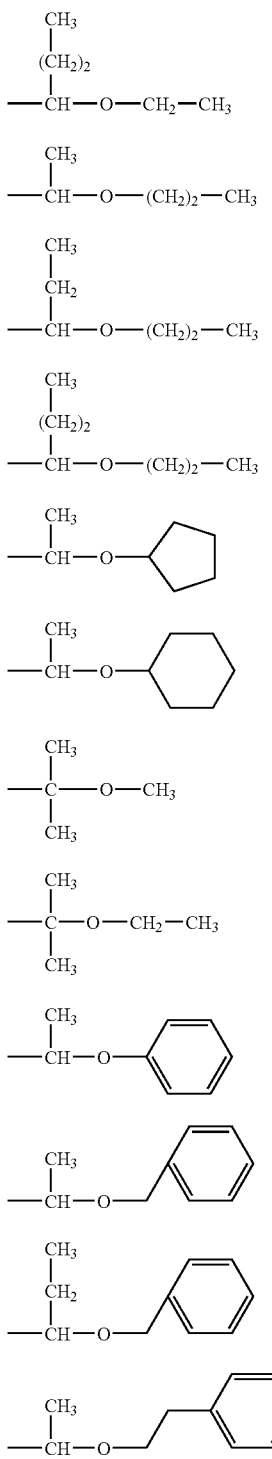

(A-2)-12
(A-2)-13
(A-2)-14
(A-2)-15
(A-2)-16
(A-2)-17
(A-2)-18
(A-2)-19
(A-2)-20
(A-2)-21
(A-2)-22
(A-2)-23

Of the acid labile groups of formula (A-2), examples of cyclic groups include tetrahydrofuran-2-yl, 2-methyltetrahydrofuran-2-yl, tetrahydropyran-2-yl and 2-methyltetrahydropyran-2-yl.

In an alternative embodiment, the polymer may be crosslinked within the molecule or between molecules with acid labile groups of the general formula (A-2a) or (A-2b).

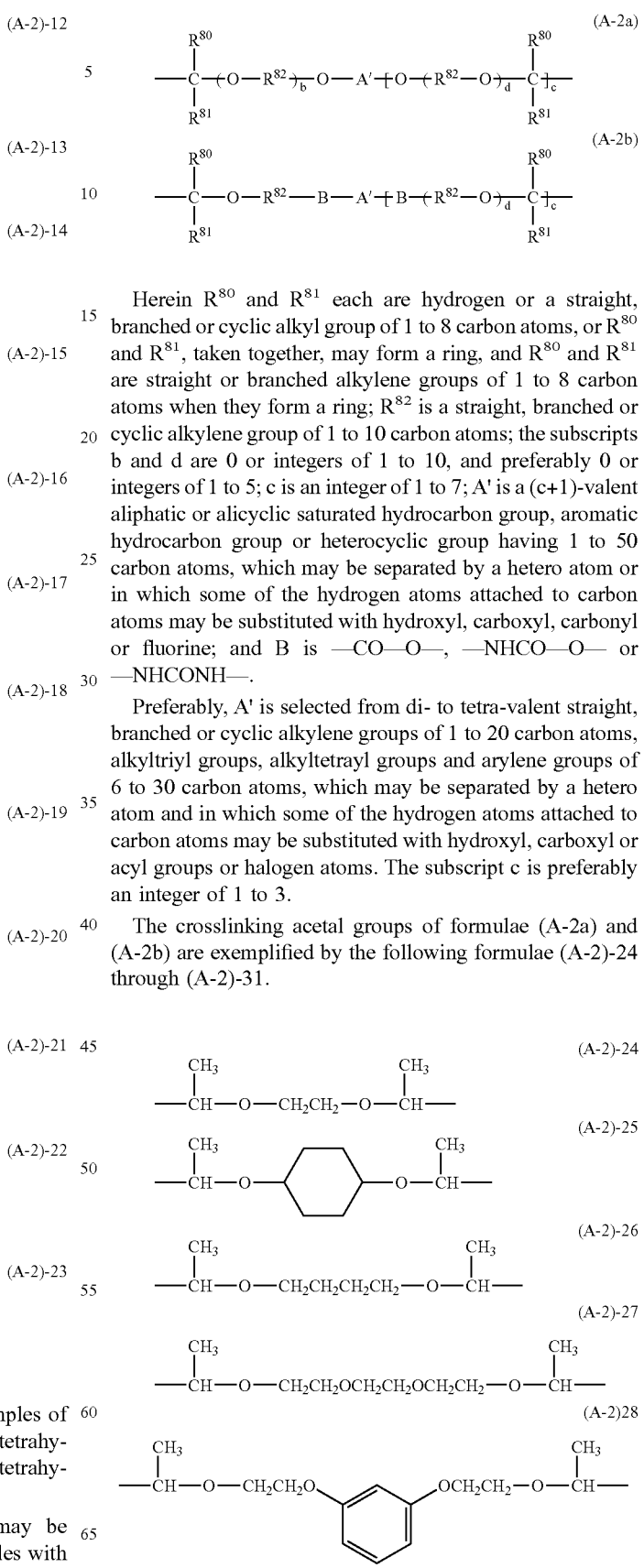

Herein $R^{80}$ and $R^{81}$ each are hydrogen or a straight, branched or cyclic alkyl group of 1 to 8 carbon atoms, or $R^{80}$ and $R^{81}$, taken together, may form a ring, and $R^{80}$ and $R^{81}$ are straight or branched alkylene groups of 1 to 8 carbon atoms when they form a ring; $R^{82}$ is a straight, branched or cyclic alkylene group of 1 to 10 carbon atoms; the subscripts b and d are 0 or integers of 1 to 10, and preferably 0 or integers of 1 to 5; c is an integer of 1 to 7; A' is a (c+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—.

Preferably, A' is selected from di- to tetra-valent straight, branched or cyclic alkylene groups of 1 to 20 carbon atoms, alkyltriyl groups, alkyltetrayl groups and arylene groups of 6 to 30 carbon atoms, which may be separated by a hetero atom and in which some of the hydrogen atoms attached to carbon atoms may be substituted with hydroxyl, carboxyl or acyl groups or halogen atoms. The subscript c is preferably an integer of 1 to 3.

The crosslinking acetal groups of formulae (A-2a) and (A-2b) are exemplified by the following formulae (A-2)-24 through (A-2)-31.

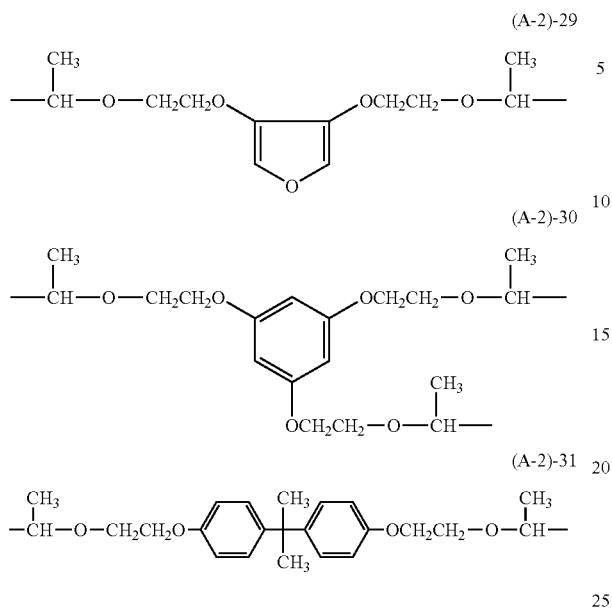

(A-2)-29

(A-2)-30

(A-2)-31

Referring to formula (A-3), each of $R^{74}$, $R^{75}$ and $R^{76}$ is a monovalent hydrocarbon group, typically a straight, branched or cyclic alkyl group of 1 to 20 carbon atoms, which may contain a hetero atom such as oxygen, sulfur, nitrogen or fluorine. A pair of $R^{74}$ and $R^{75}$, $R^{74}$ and $R^{76}$, or $R^{75}$ and $R^{76}$ may bond together to form a ring of 3 to 20 carbon atoms with the carbon atom to which they are attached.

Suitable tertiary alkyl groups of formula (A-3) include, but are not limited to, tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Also included in the tertiary alkyl groups are those of formulae (A-3)-1 to (A-3)-18 below.

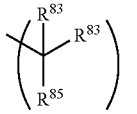

(A-3)-1

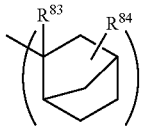

(A-3)-2

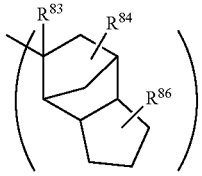

(A-3)-3

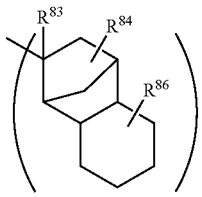

(A-3)-4

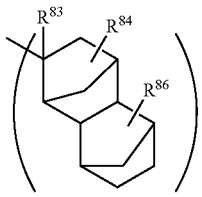

(A-3)-5

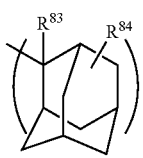

(A-3)-6

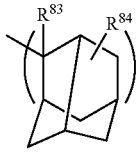

(A-3)-7

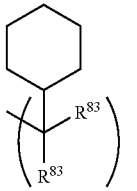

(A-3)-8

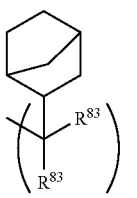

(A-3)-9

(A-3)-10

(A-3)-11

(A-3)-12

(A-3)-13

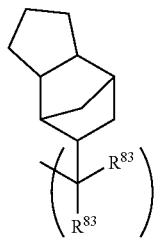
(A-3)-14

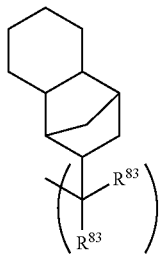
(A-3)-15

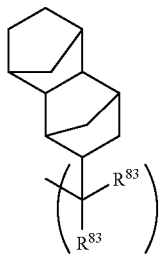
(A-3)-16

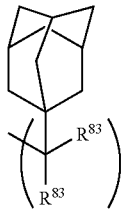
(A-3)-17

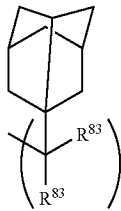
(A-3)-18

In the above formulae (A-3)-1 to (A-3)-18, $R^{83}$ is each independently a straight, branched or cyclic alkyl group of 1 to 8 carbon atoms or an aryl group of 6 to 20 carbon atoms, typically phenyl; each of $R^{84}$ and $R^{86}$ is hydrogen or a straight, branched or cyclic alkyl group of 1 to 20 carbon atoms; and $R^{85}$ is an aryl group of 6 to 20 carbon atoms, typically phenyl.

In a further embodiment, the polymer may be crosslinked within the molecule or between molecules with groups containing a di- or polyvalent alkylene or arylene group ($R^{87}$), represented by the general formula (A-3)-19 or (A-3)-20.

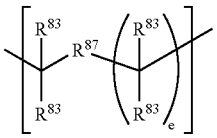
(A-3)-19

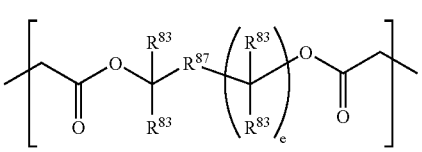
(A-3)-20

In formulae (A-3)-19 and (A-3)-20, $R^{83}$ is as defined above; $R^{87}$ is a straight, branched or cyclic alkylene group of 1 to 20 carbon atoms or an arylene group such as phenylene, which may contain a hetero atom such as oxygen, sulfur or nitrogen atom; e is an integer of 1 to 3.

Each of $R^{74}$, $R^{75}$ and $R^{76}$ in formula (A-3) may be a hydrocarbon group which contains a hetero atom such as oxygen, nitrogen or sulfur, examples of which are shown below by formulae (A)-1 to (A)-7.

—(CH$_2$)$_4$OH (A)-1

—(CH$_2$)$_2$O(CH$_2$)$_3$CH$_3$ (A)-2

(A)-3

—(CH$_2$)$_2$O(CH$_2$)$_2$OH (A)-4

—(CH$_2$)$_6$OH (A)-5

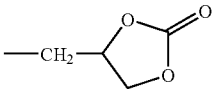
(A)-6

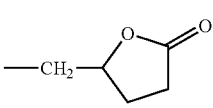
(A)-7

In formulae (A-1), (A-2) and (A-3), $R^{70}$, $R^{73}$ and $R^{76}$ are independently selected from substituted or unsubstituted aryl groups, typically phenyl, p-methylphenyl, p-ethylphenyl and alkoxy-substituted phenyl groups such as p-methoxyphenyl, aralkyl groups such as benzyl and phenethyl, the foregoing groups which contain an oxygen atom or the foregoing groups in which a hydrogen atom attached to a carbon atom is substituted with a hydroxyl group or two hydrogen atoms are substituted with an oxygen atom to form a carbonyl group, i.e., alkyl groups as represented by formulae (A)-1 to (A)-7, and oxoalkyl groups of formula (A)-8 or (A)-9.

(A)-8

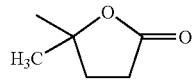

Examples of the trialkylsilyl group whose alkyl moiety each has 1 to 6 carbon atoms used as the acid labile group of $R^5$ include trimethylsilyl, triethylsilyl and tert-butyldimethylsilyl.

In addition to the above-described monomers, the silicon-containing polymer of the invention may have copolymerized therewith a monomer having a substituent group for improving adhesion. The adhesion-improving monomer denotes a monomer containing a hydrophilic substituent group such as anhydride, ester (or lactone), carbonate, alcohol, amide or ketone, examples of which are given below.

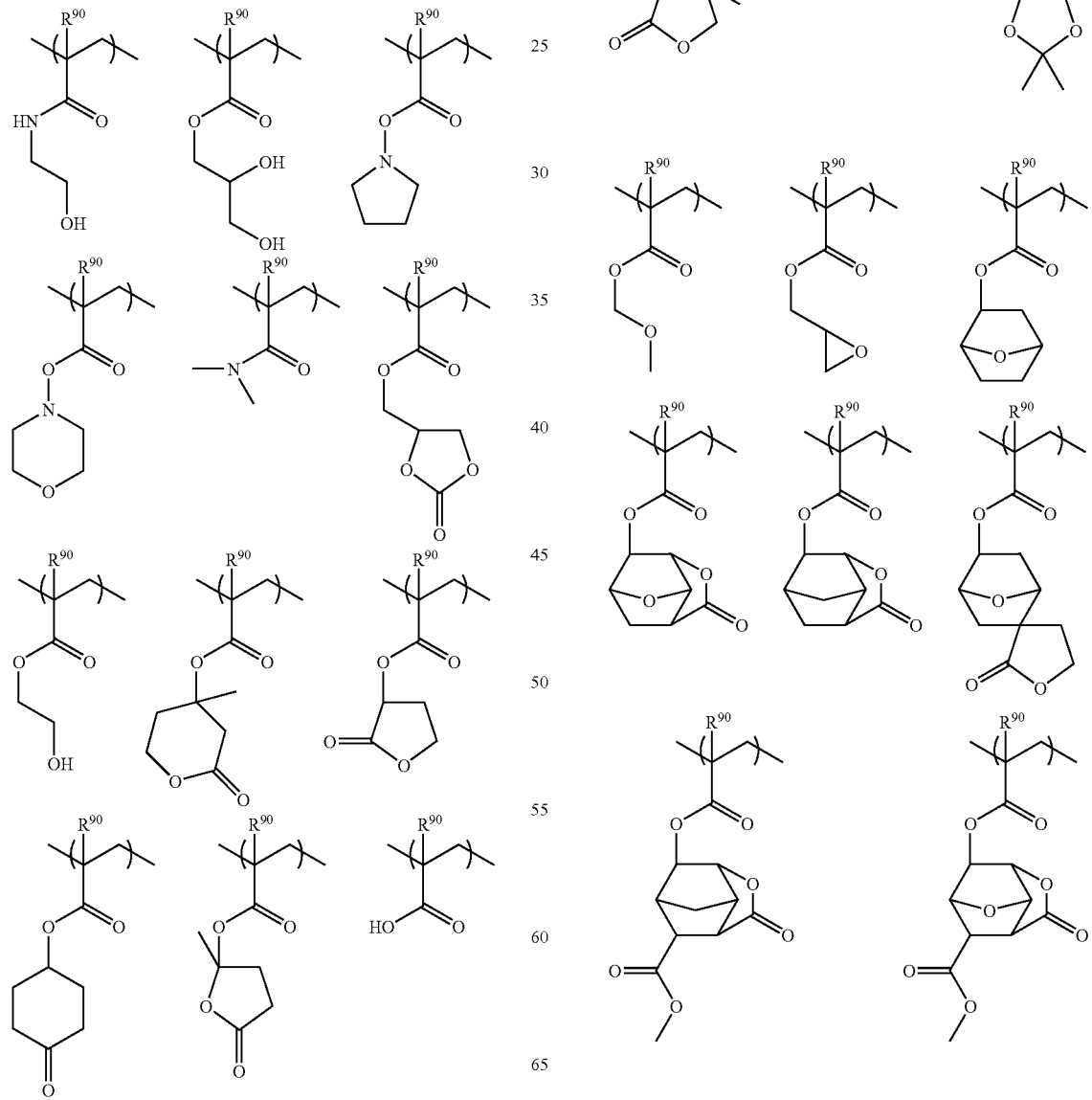

-continued

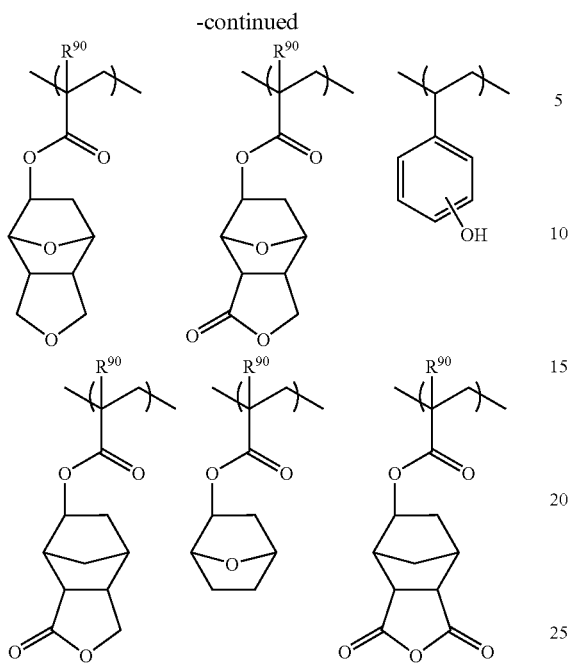

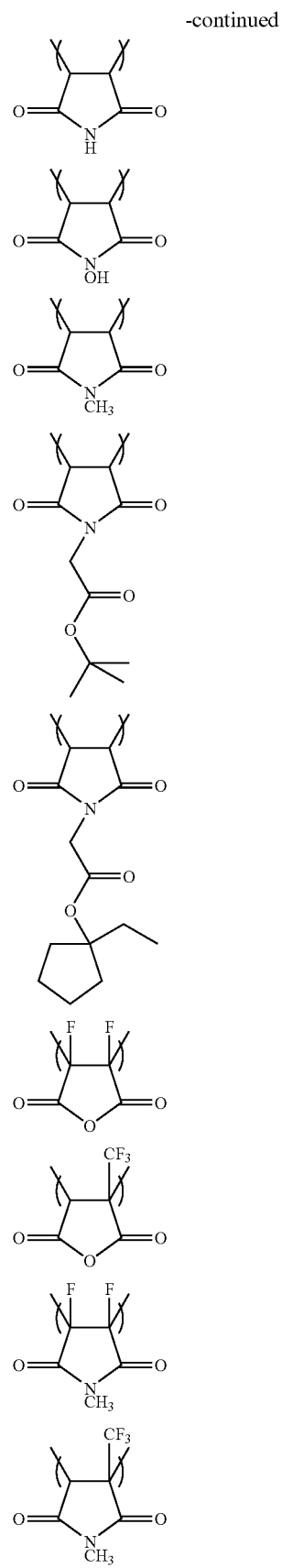

Herein, $R^{90}$ is hydrogen, methyl or cyano.

It is noted that the recurring units "f" represented by the general formula (18) result from polymerization of a vinylsilane or allylsilane derivative, which is known to form an alternating copolymer with maleic anhydride or a maleimide derivative serving as recurring units "g" shown below.

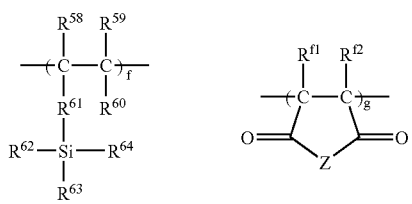

Herein, $R^{58}$ to $R^{64}$ are as defined above, each of $R^{f1}$ and $R^{f2}$ which may be the same or different is hydrogen, fluorine or trifluoromethyl, and Z is O, S, NH, NOH, $NCH_3$ or $NCH_2COO-R^{65}$ wherein $R^{65}$ is a straight, branched or cyclic alkyl group of 4 to 10 carbon atoms, preferably tertiary alkyl.

Suitable recurring units "g" include those of the following formulae (g)-1 to (g)-11.

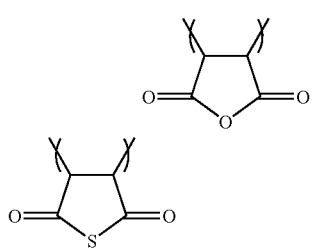

9g0-1

It is also known that the recurring units "f" represented by formula (18) form an alternating copolymer with recurring units "h" as shown below.

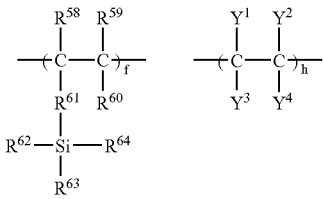

Herein, $R^{58}$ to $R^{64}$ are as defined above, each of $Y^1$, $Y^2$, $Y^3$ and $Y^4$ which may be the same or different is a hydrogen atom, fluorine atom, chlorine atom, bromine atom, cyano group, alkoxycarbonyl group, or fluorinated alkyl group.

Examples of the recurring units "h" which can be polymerized include those of the following formulae (h)-1 to (h)-8.

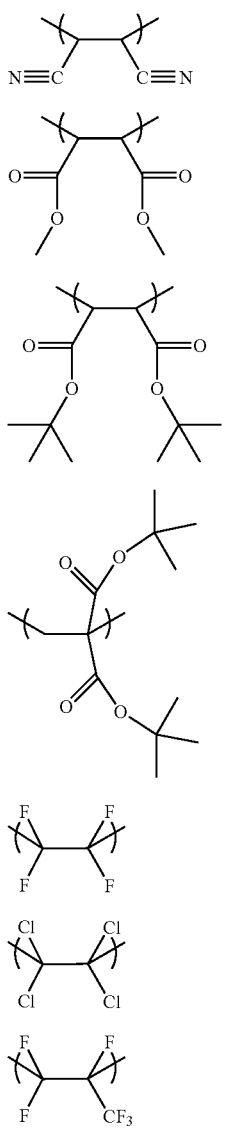

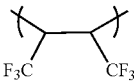

(h)-8

The polymers of the invention are generally synthesized by dissolving the essential monomers and an optional monomer or monomers in a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for preparation of the polymers of the invention are radical polymerization of triggering polymerization with radicals such as peroxides (e.g., benzoyl peroxide) and azo compounds (e.g., AIBN), anionic polymerization using catalysts such as naphthyl naphthalene and alkyl lithium, and cationic polymerization using sulfuric acid and Lewis acid catalysts. These polymerization steps may be carried out in their conventional manner.

The polymer is composed essentially of recurring units "a1" having a substituent group of formula (1) to (3), especially recurring units "a1" of formula (4) to (8), and recurring units "a2" containing silicon of formula (9) or (18), to which recurring units "a3" derived from a monomer having an acid labile group of formula (A-1) to (A-3), recurring units "a4" derived from a monomer having a substituent group for enhancing adhesion, recurring units (g) "a5," and recurring units (h) "a6" are optionally incorporated. The preferred contents of units "a1" to "a6" are in the following range.

$$0.1 \leq a1/(a1+a2+a3+a4+a5+a6) \leq 0.85$$

$$0.05 \leq a2/(a1+a2+a3+a4+a5+a6) \leq 0.8$$

$$0 \leq a3/(a1+a2+a3+a4+a5+a6) \leq 0.5$$

$$0.1 \leq a4/(a1+a2+a3+a4+a5+a6) \leq 0.85$$

$$0 \leq a5/(a1+a2+a3+a4+a5+a6) \leq 0.7$$

$$0 \leq a6/(a1+a2+a3+a4+a5+a6) \leq 0.7$$

Also contemplated herein is a polymer having copolymerized therewith silicon-containing groups of plural types or acid labile groups of plural types represented by the formulae (1) to (3), or a blend of plural polymers having copolymerized therewith different silicon-containing groups or different adhesive groups represented by the formulae (1) to (3). It is also acceptable to blend plural polymers having different molecular weight or dispersity.

The polymers preferably have a weight average molecular weight (Mw) of about 1,000 to 100,000, more preferably about 2,000 to 50,000, as determined by gel permeation chromatography (GPC) using polystyrene standards, and a molecular weight dispersity (Mw/Mn) of 1.0 to 3.0, more preferably 1.0 to 2.0. It is recommended that the polymer product as polymerized is processed into a narrow disperse polymer having a dispersity of up to 1.5 by cutting off a high- or low-molecular weight fraction because an improvement in resist resolution is expectable.

Resist Composition

The polymer of the invention is useful as a base resin in a resist composition. Therefore, in another aspect, the invention provides a resist composition comprising the polymer. The resist composition of the invention is advantageously a chemical amplification type resist composition, and especially a chemical amplification type positive working resist composition.

In one embodiment, the chemically amplified positive resist composition is defined as comprising (A) the above-defined polymer as a base resin, (B) a photoacid generator, (C) an organic solvent, and preferably (D) a dissolution inhibitor and/or (E) a basic compound.

Component (C)

The organic solvent (C) used in the resist composition of the invention may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, preferred are diethylene glycol dimethyl ether, 1-ethoxy-2-propanol and propylene glycol monomethyl ether acetate, in which the photoacid generator is most soluble, and mixtures thereof.

The organic solvent is preferably added in an amount of about 200 to 1,000 parts, especially about 400 to 800 parts by weight per 100 parts by weight of the base resin (all parts are by weight, hereinafter).

Component (B)

The photoacid generator (B) used in the inventive resist composition is a compound capable of generating an acid upon exposure to high energy radiation or electron beams. Suitable photoacid generators include (i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.
(i) Onium salts of formula (P1a-1), (P1a-2) or (P1b):

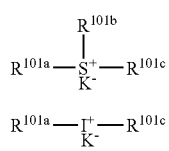

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

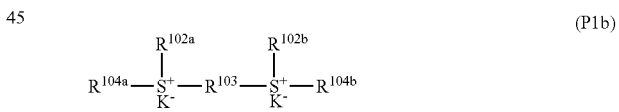

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1a-1) and (P1a-2).

(ii) Diazomethane derivatives of formula (P2)

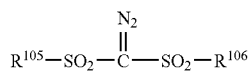
(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime derivatives of formula (P3)

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone derivatives of formula (P4)

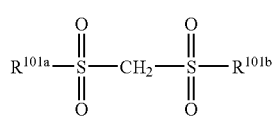
(P4)

Herein, $R^{101a}$ and $R^{101b}$ are as defined above.

(v) Sulfonic acid esters of N-hydroxyimide compounds of formula (P5)

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate, triphenylsulfonium p-toluenesulfonate, (p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these photoacid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate, (2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of 0.1 to 50 parts, and especially 0.5 to 40 parts, per 100 parts of the base resin. Less than 0.1 part of the photoacid generator generates a less amount of acid, sometimes resulting in a poor sensitivity and resolution whereas more than 50 parts of the photoacid generator may adversely affect transmittance, resulting in a poor resolution.

Component (D)

To the resist composition, a dissolution inhibitor may be added. The dissolution inhibitor is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

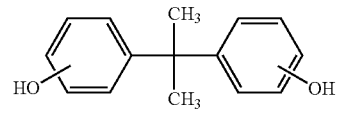
(D1)

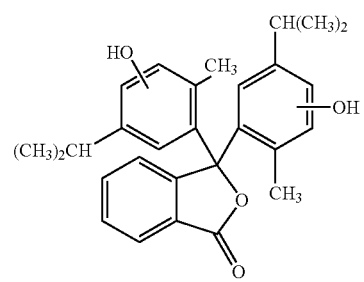
(D2)

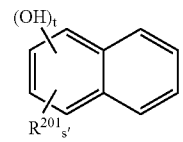
(D3)

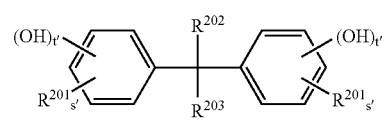
(D4)

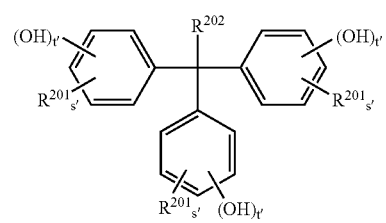
(D5)

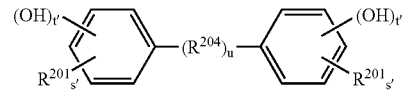
(D6)

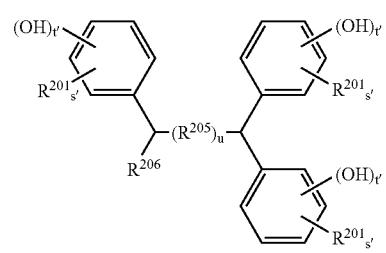
(D7)

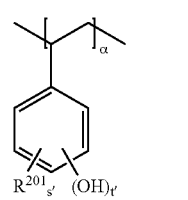
(D8)

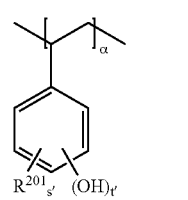
(D9)

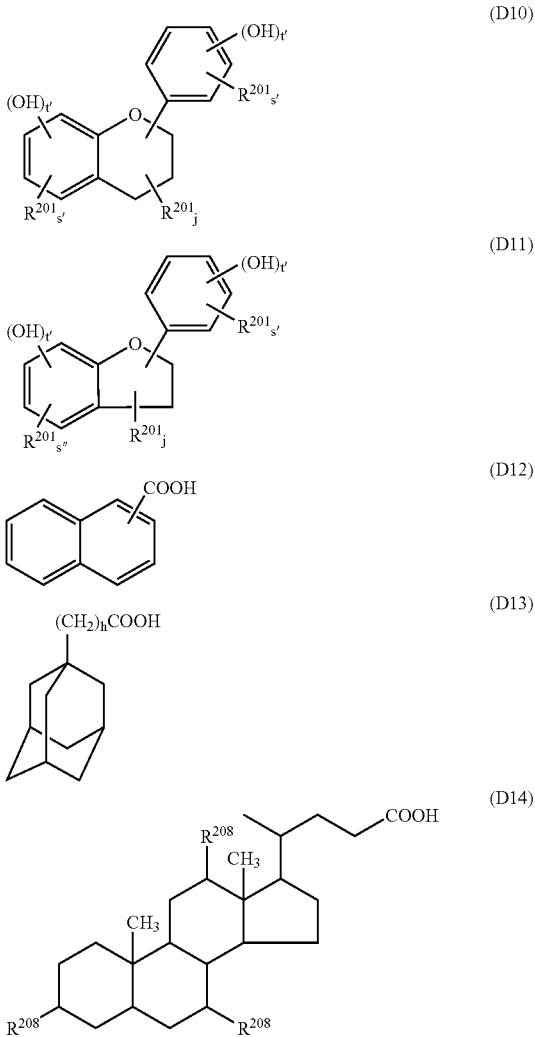

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or —$(R^{207})_h$—COOH; $R^{204}$ is —$(CH_2)_i$— (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1; s, t, s', t', s'', and t'' are each numbers which satisfy s+t=8, s'+t'=5, and s''+t''=4, and are such that each phenyl skeleton has at least one hydroxyl group; and α is a number such that the compounds of formula (D8) or (D9) have a molecular weight of from 100 to 1,000.

The foregoing compounds have a weight average molecular weight of from 100 to 1,000, preferably 150 to 800.

The dissolution inhibitor may be formulated in an amount of 0 to 50 parts, preferably 5 to 50 parts, and more preferably 10 to 30 parts, per 100 parts of the base resin, and may be used singly or as a mixture of two or more thereof. Less amounts of the dissolution inhibitor may fail to yield an improved resolution, whereas the use of more than 50 parts would lead to slimming of the patterned film, and thus a decline in resolution.

Component (E)

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

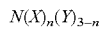
$N(X)_n(Y)_{3-n}$ (B)-1

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

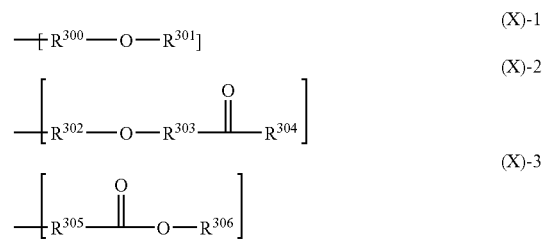

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-(2-(2-hydroxyethoxy)ethoxy)ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)ethylamine,
N,N-bis(2-acetoxyethyl)-2-(tetrahydrofurfuryloxycarbonyl)ethylamine,
N,N-bis(2-hydroxyethyl)-2-[(2-oxotetrahydrofuran-3-yl)oxycarbonyl]ethylamine,
N,N-bis(2-acetoxyethyl)-2-[(2-oxotetrahydrofuran-3-yl)oxycarbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)ethylamine,
N,N-bis(2-formyloxyethyl)-2-(2-formyloxyethoxycarbonyl)ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are one or more of cyclic structure-bearing basic compounds having the following general formula (B)-2.

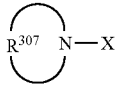
(B)-2

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include
1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate,
2-piperidinoethyl acetate,
2-morpholinoethyl acetate,
2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate,
methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone,
β-morpholino-δ-valerolactone,
methyl 1-pyrrolidinylacetate,
methyl piperidinoacetate,
methyl morpholinoacetate,
methyl thiomorpholinoacetate,
ethyl 1-pyrrolidinylacetate, and
2-methoxyethyl morpholinoacetate.

Also, one or more of cyano-bearing basic compounds having the following general formulae (B)-3 to (B)-6 may be blended.

(B)-3

(B)-4

(B)-5

(B)-6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate, methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiononitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiononitrile,
N-(2-cyanoethyl)-N-tetrahydrofurfuryl-3-aminopropiononitrile,
N,N-bis(2-cyanoethyl)-3-aminopropiononitrile, diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopripionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl)aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile,
1-piperidinepropiononitrile,
4-morpholinepropiononitrile,
1-pyrrolidineacetonitrile,
1-piperidineacetonitrile,
4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

The basic compounds may be used alone or in admixture of two or more. The basic compound is preferably formulated in an amount of 0.001 to 2 parts, and especially 0.01 to 1 part, per 100 parts of the entire base resin in the resist composition. Less than 0.001 part of the basic compound would fail to provide the desired effect whereas more than 2 parts of the basic compound would result in too low a sensitivity.

In the resist composition, a compound bearing a ≡C—COOH group in a molecule may be blended. Exemplary, non-limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —$R^{401}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

(A1)

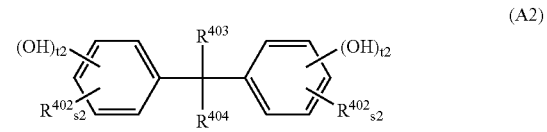

(A2)

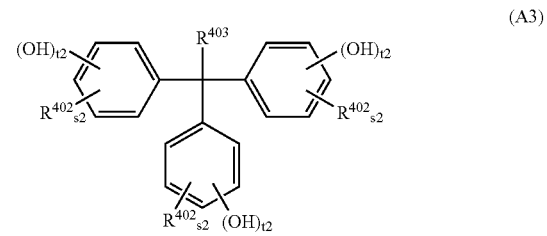

(A3)

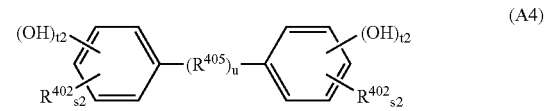

(A4)

-continued

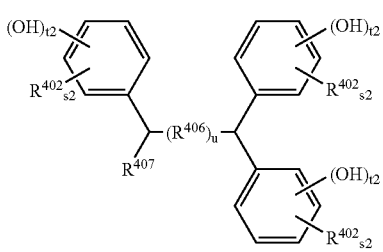
(A5)

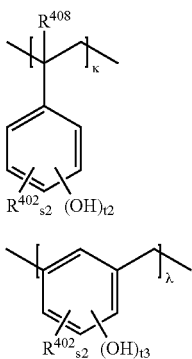
(A6)

(A7)

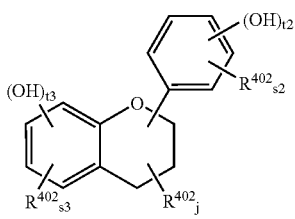
(A8)

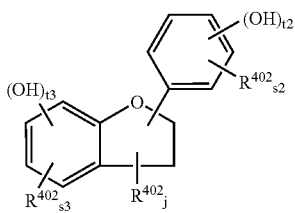
(A9)

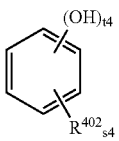
(A10)

In these formulas, $R^{408}$ is hydrogen or methyl; $R^{402}$ and $R^{403}$ are each hydrogen or a straight or branched alkyl or alkenyl of 1 to 8 carbon atoms; $R^{404}$ is hydrogen, a straight or branched alkyl or alkenyl of 1 to 8 carbon atoms, or a —($R^{409}$)$_h$—COOR' group (R' being hydrogen or —$R^{409}$—COOH); $R^{405}$ is —(CH$_2$)$_i$— (wherein i is 2 to 10), an arylene of 6 to 10 carbon atoms, carbonyl, sulfonyl, an oxygen atom, or a sulfur atom; $R^{406}$ is an alkylene of 1 to 10 carbon atoms, an arylene of 6 to 10 carbon atoms, carbonyl, sulfonyl, an oxygen atom, or a sulfur atom; $R^{407}$ is hydrogen, a straight or branched alkyl or alkenyl of 1 to 8 carbon atoms, or a hydroxyl-substituted phenyl or naphthyl; $R^{409}$ is a straight or branched alkyl or alkenyl of 1 to 10 carbon atoms or a —$R^{411}$—COOH group; $R^{410}$ is hydrogen, a straight or branched alkyl or alkenyl of 1 to 8 carbon atoms or a —$R^{411}$—COOH group; $R^{411}$ is a straight or branched alkylene of 1 to 10 carbon atoms; the letter j is an integer from 0 to 3; u and h are each 0 or 1; s1 to s4 and t1 to t4 each are numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

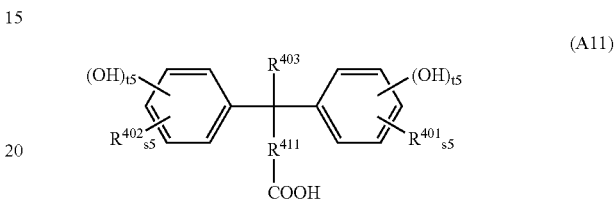
(A11)

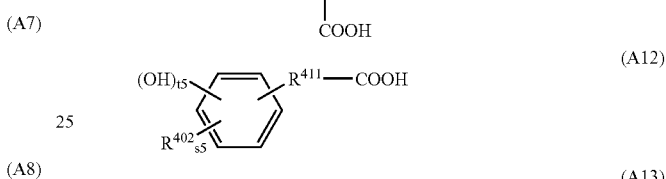
(A12)

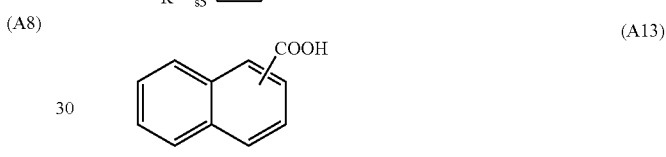
(A13)

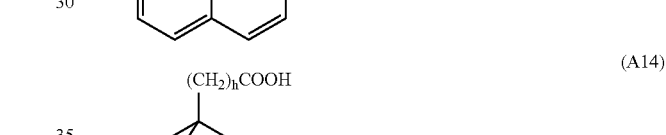
(A14)

(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is equal to 0 or 1.

Illustrative, non-limiting examples of the compound bearing a ≡C—COOH group include compounds of the general formulas AI-1 to AI-14 and AII-1 to AII-10 below.

(AI-1)

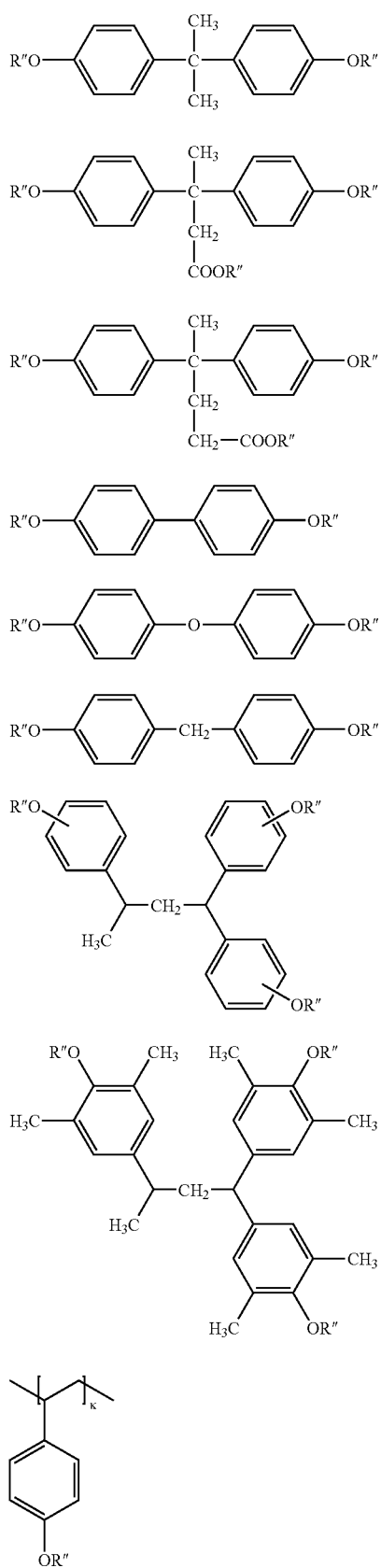
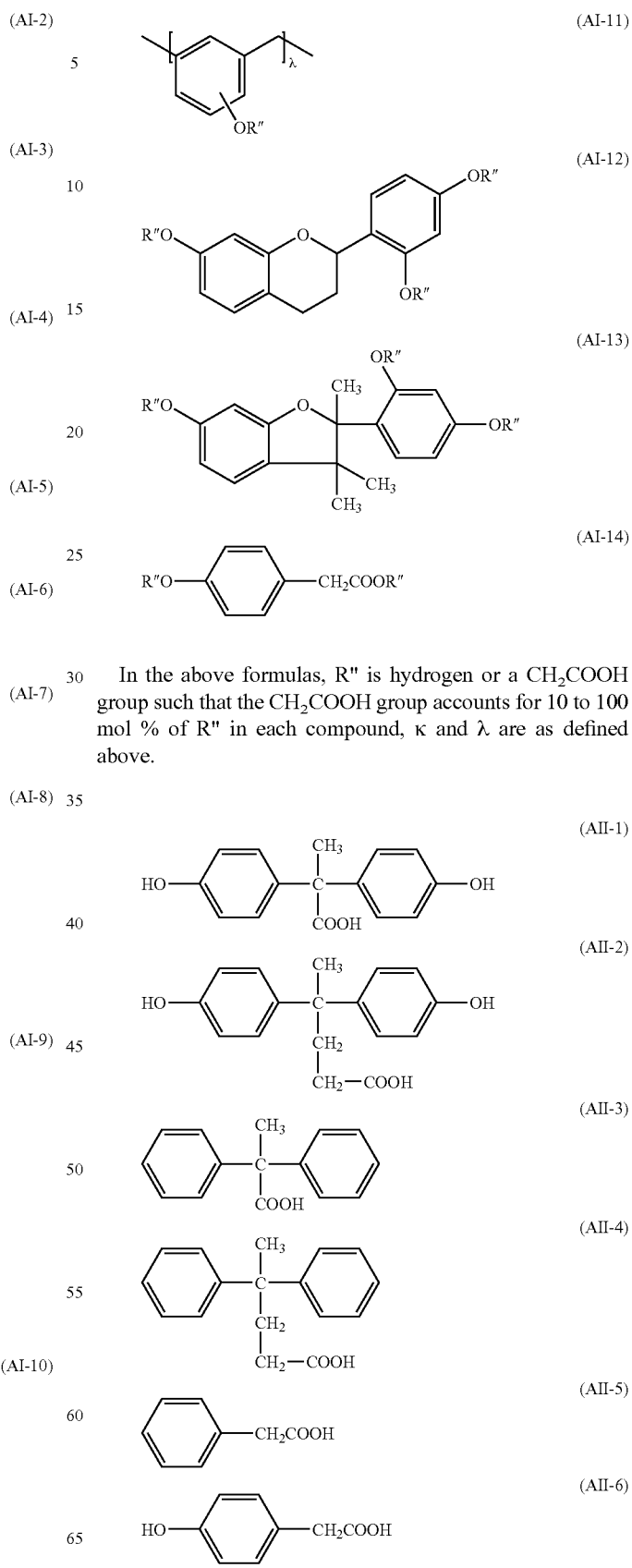
In the above formulas, R″ is hydrogen or a CH₂COOH group such that the CH₂COOH group accounts for 10 to 100 mol % of R″ in each compound, κ and λ are as defined above.

-continued

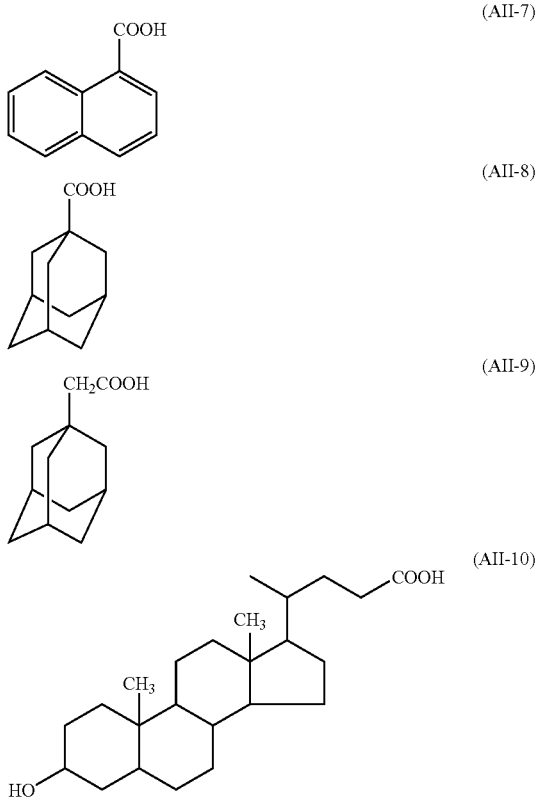

(AII-7)
(AII-8)
(AII-9)
(AII-10)

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts, per 100 parts of the base resin. More than 5 parts of the compound can reduce the resolution of the resist composition.

In the resist composition, a surfactant may be blended. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dainippon Ink & Chemicals, Inc.), Fluorad FC430, FC431 and FC-4430 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, FC-4430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part, per 100 parts of the solids in the resist composition.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for 30 seconds to 5 minutes. A patterning mask having the desired pattern may then be placed over the resist film, and the film exposed through the mask to an electron beam or to high-energy radiation having a wavelength of less than 300 nm, such as deep-UV rays, excimer laser beams, or x-rays in an exposure dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for 30 seconds to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF (193 nm), Kr$_2$ (146 nm) or KrAr (134 nm) excimer laser or a laser, especially F$_2$ (157 nm) or Ar$_2$ (126 nm) laser, x-rays, or an electron beam. The desired pattern may not be obtainable outside the upper and lower limits of the above range.

Figure 1B:
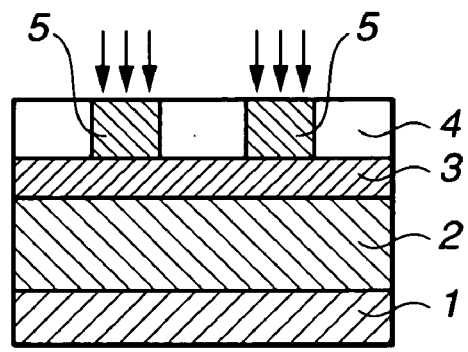
Figure 1C:
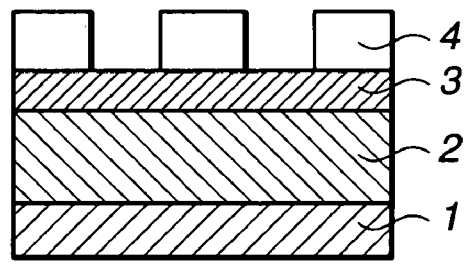
Figure 1D:
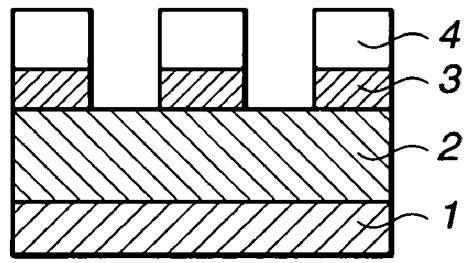
Figure 1E:
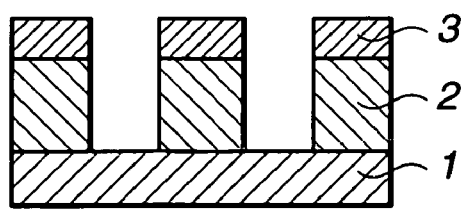

Referring to FIG. 1, there is illustrated in cross section a process involving forming a silicon-containing resist pattern through exposure, PEB and development steps, patterning an underlying organic film by oxygen gas etching, and processing a further underlying film by dry etching. In FIG. 1A, a layer structure includes a support substrate 1, a processable substrate 2 of SiO$_2$, SiN or the like, an organic film 3 of a novolac resin, polyhydroxystyrene or the like, and a resist layer 4 formed of the resist composition of the invention. In FIG. 1B, selected areas 5 of the resist layer 4 are exposed to light. PEB and development are then carried out to remove the exposed areas as shown in FIG. 1C. In FIG. 1D, the exposed areas of the organic film 3 are etched away with oxygen plasma. In FIG. 1E, the exposed areas of the processable substrate 2 are etched away with CF gas, completing the pattern.

The oxygen gas etching is a reactive plasma etching using oxygen gas as a main component and can process the underlying organic film at a high aspect ratio. SO$_2$, N$_2$, NO$_2$, NH$_3$, CO or CO$_2$ gas may be added to oxygen gas for protecting side walls for preventing the film from being configured to a T-top profile by overetching. Prior to the oxygen gas etching, brief etching with a fluorocarbon gas may be carried out for removing any scum of the resist after development and smoothening line edges to prohibit roughening. The subsequent dry etching of the processable film may be etching using a fluorocarbon gas as a main component when the processable film is SiO$_2$ or Si$_3$N$_4$. Exemplary fluorocarbon gases are $CF_4$, $CHF_3$, $CH_2F_2$, $C_2F_6$, $C_3F_8$, $C_4F_{10}$ and $C^5F_{12}$. At the same time as the dry etching of the processable film, the silicon-containing resist film can be stripped off. Etching with chlorine or bromine gas as a main component is employed when the processable film is polysilicon, tungsten silicide or TiN/Al.

Since the resist composition of the invention has excellent resistance to etching with chlorine or bromine gas as a main component, the processing technique may be the same as used for the single layer resist.

Figure 2A:
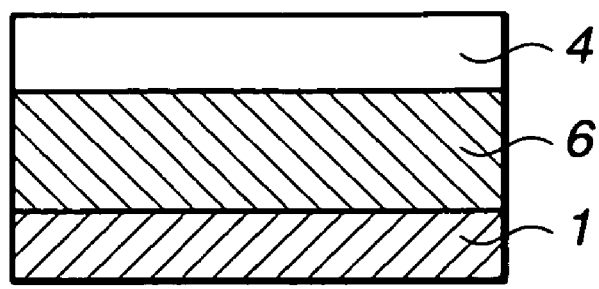
FIG. 2 schematically illustrates a layer structure patterning process involving chlorine etching.
Figure 2B:
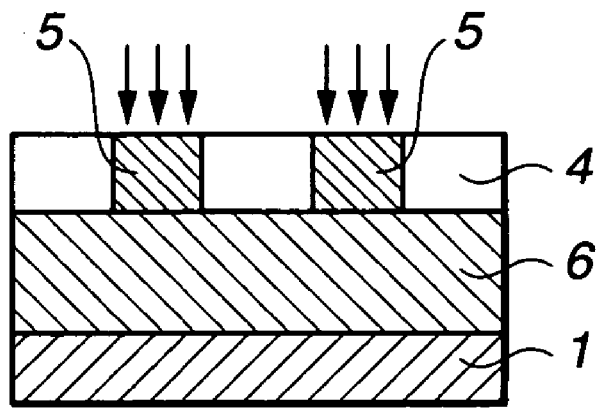
Figure 2C:
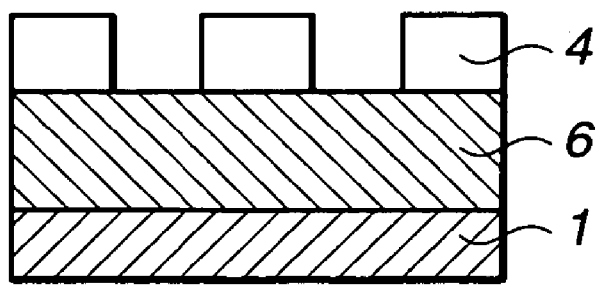
Figure 2D:
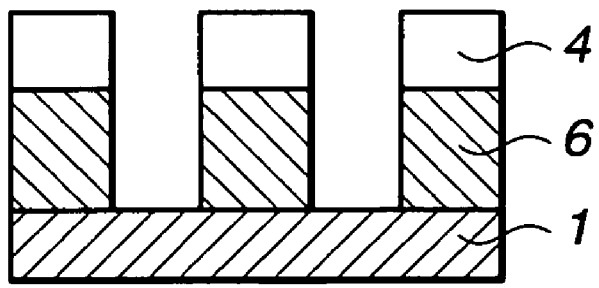

This embodiment is illustrated in FIG. 2. The layer structure shown in FIG. 2A includes a support substrate 1, a processable substrate 6, and a resist layer 4 according to the invention. Exposure of selected areas 5 of the resist layer 4 is followed by PEB and development as shown in FIGS. 2B and 2C. Thereafter, the processable substrate 6 is etched with a Cl gas as shown in FIG. 2D. In this embodiment, the silicon-containing resist film according to the invention is formed in a desired pattern directly on the processable film, which can be processed by etching with chlorine or bromine gas as a main component.

EXAMPLE

Synthesis Examples and Examples are given below together with Comparative Examples for further illustrating the invention although the invention is not limited thereby. The abbreviations used herein are GPC for gel permeation chromatography, NMR for nuclear magnetic resonance, Mw for weight average molecular weight, Mn for number average molecular weight, THF for tetrahydrofuran, and AIBN for 2,2'-azobis(2,4-dimethylvaleronitrile).

(1) Synthesis of Silicon-containing Polymers

Monomers 1 to 7 used in Synthesis Examples are identified below.

Monomer 1: 1-(2-tetrahydrofuranyl)cyclopentyl methacrylate

Monomer 2: 1-(7-oxanorbornan-2-yl)cyclopentyl methacrylate

Monomer 3: 1-(2-tetrahydrofuranyl)cyclopentyl 5-norbornene-2-carboxylate

Monomer 4: 1-(7-oxanorbornan-2-yl)cyclopentyl 5-norbornene-2-carboxylate

Monomer 5: tris(trimethylsilyl)silylethyl methacrylate

Monomer 6: 3-oxo-2,7-dioxatricyclo[4.2.1.0$^{4.8}$]-9-nonane methacrylate

Monomer 7: vinylheptamethylcyclotetrasiloxane

Monomer 8: 3-(3,5,7,9,11,13,15-heptacyclopentylpentacyclo-[9.5.1.1$^{3.9}$.1$^{5,15}$.1$^{7,13}$]octasiloxan-1-yl)propyl methacrylate Monomer 1

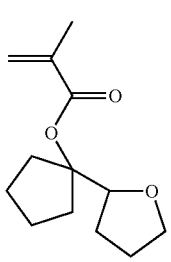

-continued

Monomer 2

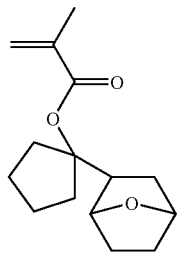

Monomer 3

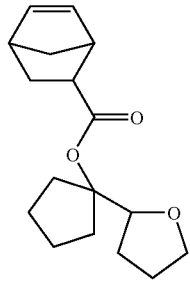

Monomer 4

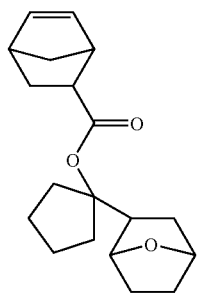

Monomer 5

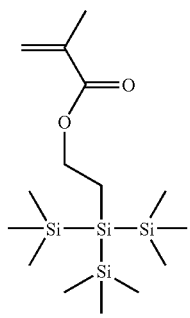

Monomer 6

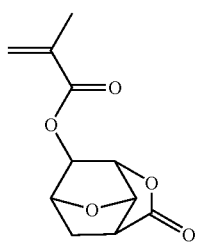

Monomer 7

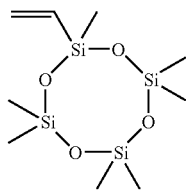

Monomer 8

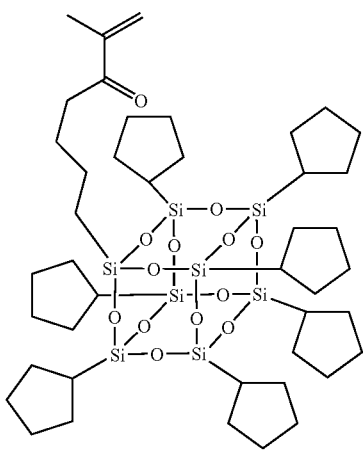

Synthesis Example 1

Synthesis of 1-(2-tetrahydrofuranyl)cyclopentyl methacrylate/1-tris(trimethylsilyl)silylethyl methacrylate/p-hydroxystyrene copolymer (10:15:75), Polymer 1

In a 1-liter flask, 22.4 g of Monomer 1, 64.8 g of Monomer 5 and 90.0 g of 4-hydroxystyrene were dissolved in 300 ml of THF. The reactor was cooled to −70° C., and vacuum extraction and nitrogen blow were repeated three times until the system was thoroughly purged of oxygen. In the nitrogen atmosphere, 5 g of the initiator AIBN was added to the flask, which was heated to 60° C., whereupon polymerization reaction was conducted for 24 hours.

The polymer product was worked up by pouring the reaction mixture into a solvent mixture of hexane/ether (3/2) for precipitation. The polymer was separated. There was obtained 132 g of a white polymer that is a 1-(2-tetrahydrofuranyl)cyclopentyl methacrylate/1-tris(trimethylsilyl)-silylethyl methacrylate/p-hydroxystyrene copolymer, designated Polymer 1.

Polymer 1 had a weight average molecular weight (Mw) of 16,000 as measured by the light scattering method and a dispersity (Mw/Mn) of 1.65 as determined from the GPC elution curve. A $^1$H-NMR analysis demonstrated that Polymer 1 consisted of recurring units derived from the monomers in a molar ratio of 10:15:75.

Synthesis Example 2

Synthesis of 1-(7-oxanorbornan-2-yl)cyclopentyl methacrylate/1-tris(trimethylsilyl)silylethyl methacrylate/p-hydroxy-styrene copolymer (8:15:77), Polymer 2

In a 1-liter flask, 25.4 g of Monomer 2, 64.8 g of Monomer 5 and 90.0 g of 4-hydroxystyrene were dissolved in 300 ml of THF. The reactor was cooled to −70° C., and vacuum extraction and nitrogen blow were repeated three times until the system was thoroughly purged of oxygen. In the nitrogen atmosphere, 5 g of the initiator AIBN was added to the flask, which was heated to 60° C., whereupon polymerization reaction was conducted for 24 hours.

The polymer product was worked up by pouring the reaction mixture into a solvent mixture of hexane/ether (3/2) for precipitation. The polymer was separated. There was obtained 130 g of a white polymer that is a 1-(7-oxanorbornan-2-yl)cyclopentyl methacrylate/1-tris(trimethyl-silyl)silylethyl methacrylate/p-hydroxystyrene copolymer, designated Polymer 2.

Polymer 2 had a weight average molecular weight (Mw) of 15,500 as measured by the light scattering method and a dispersity (Mw/Mn) of 1.72 as determined from the GPC elution curve. A $^1$H-NMR analysis demonstrated that Polymer 2 consisted of recurring units derived from the monomers in a molar ratio of 8:15:77.

Synthesis Example 3

Synthesis of 1-(7-oxanorbornan-2-yl)cyclopentyl methacrylate/3-oxo-2,7-dioxatricyclo[4.2.1.0$^{4,8}$]-9-nonane methacrylate/1-tris(trimethylsilyl)silylethyl methacrylate/p-hydroxy-styrene copolymer (8:25:15:52), Polymer 3

In a 1-liter flask, 25.4 g of Monomer 2, 33.6 g of Monomer 6, 64.8 g of Monomer 5 and 62.4 g of 4-hydroxystyrene were dissolved in 300 ml of THF. The reactor was cooled to −70° C., and vacuum extraction and nitrogen blow were repeated three times until the system was thoroughly purged of oxygen. In the nitrogen atmosphere, 5 g of the initiator AIBN was added to the flask, which was heated to 60° C., whereupon polymerization reaction was conducted for 24 hours.

The polymer product was worked up by pouring the reaction mixture into a solvent mixture of hexane/ether (3/2) for precipitation. The polymer was separated. There was obtained 139 g of a white polymer that is a 1-(7-oxanorbornan-2-yl)cyclopentyl methacrylate/3-oxo-2,7-dioxatricyclo[4.2.1.0$^{4,8}$]-9-nonane methacrylate/1-tris(trimethylsilyl)silylethyl methacrylate/p-hydroxystyrene copolymer, designated Polymer 3.

Polymer 3 had a weight average molecular weight (Mw) of 15,500 as measured by the light scattering method and a dispersity (Mw/Mn) of 1.69 as determined from the GPC elution curve. A $^1$H-NMR analysis demonstrated that Polymer 3 consisted of recurring units derived from the monomers in a molar ratio of 8:25:15:52.

Synthesis Example 4

Synthesis of 1-(7-oxanorbornan-2-yl)cyclopentyl methacrylate/vinylheptamethylcyclotetrasiloxane/maleic anhydride copolymer (40:12:48), Polymer 4

Into a 200-ml flask, 22.4 g of Monomer 2, 10 g of Monomer 7 and 12.0 g of maleic anhydride were admitted. The reactor was cooled to −70° C., and vacuum extraction and nitrogen blow were repeated three times. In the nitrogen atmosphere, the flask was heated to room temperature, 4.0 g of the initiator AIBN was added to the flask, which was heated again to 55° C., whereupon reaction was conducted for 25 hours. The reaction solution was diluted with 5 ml of acetone and then poured into 4.5 liters of isopropyl alcohol for precipitation. The resulting white solid was filtered and dried in vacuum at 40° C. There was obtained 26 g of a white polymer that is a 1-(7-oxanorbornan-2-yl)cyclopentyl methacrylate/vinylheptamethylcyclotetrasiloxane/maleic anhydride copolymer (40:12:48), designated Polymer 4.

Polymer 4 had a weight average molecular weight (Mw) of 8,500 as measured by the light scattering method and a dispersity (Mw/Mn) of 1.82 as determined from the GPC elution curve. A $^1$H-NMR analysis demonstrated that Polymer 4 consisted of recurring units derived from the monomers in a molar ratio of 40:12:48.

Synthesis Example 5

Synthesis of 1-(2-tetrahydrofuranyl)cyclopentyl 5-norbornene-2-carboxylate/vinylheptamethylcyclotetrasiloxane/maleic anhydride copolymer (38:12:50), Polymer 5

In a 200-ml flask, 27.5 g of Monomer 3, 10 g of Monomer 7 and 12.0 g of maleic anhydride were dissolved in 50 ml of propylene glycol monomethyl ether acetate. The reactor was cooled to −70° C., and vacuum extraction and nitrogen blow were repeated three times. In the nitrogen atmosphere, the flask was heated to room temperature, 4.0 g of the initiator AIBN was added to the flask, which was heated again to 55° C., whereupon reaction was conducted for 25 hours. The reaction solution was diluted with 5 ml of acetone and then poured into 4.5 liters of isopropyl alcohol for precipitation. The resulting white solid was filtered and dried in vacuum at 40° C. There was obtained 32 g of a white polymer that is a 1-(2-tetrahydrofuranyl)cyclopentyl 5-norbornene-2-carboxylate/vinylheptamethylcyclotetrasiloxane/maleic anhydride copolymer (38:12:50), designated Polymer 5.

Polymer 5 had a weight average molecular weight (Mw) of 6,500 as measured by the light scattering method and a dispersity (Mw/Mn) of 1.77 as determined from the GPC elution curve. A $^1$H-NMR analysis demonstrated that Polymer 5 consisted of recurring units derived from the monomers in a molar ratio of 38:12:50.

Synthesis Example 6

Synthesis of 1-(7-oxanorbornan-2-yl)cyclopentyl 5-norbornene-2-carboxylate/vinylheptamethylcyclotetrasiloxane/maleic anhydride copolymer (37:13:50), Polymer 6

In a 200-ml flask, 30.2 g of Monomer 4, 10 g of Monomer 7 and 12.0 g of maleic anhydride were dissolved in 50 ml of propylene glycol monomethyl ether acetate. The reactor was cooled to −70° C., and vacuum extraction and nitrogen blow were repeated three times. In the nitrogen atmosphere, the flask was heated to room temperature, 4.0 g of the initiator AIBN was added to the flask, which was heated again to 55° C., whereupon reaction was conducted for 25 hours. The reaction solution was diluted with 5 ml of acetone and then poured into 4.5 liters of isopropyl alcohol for precipitation. The resulting white solid was filtered and dried in vacuum at 40° C. There was obtained 36 g of a white polymer that is a 1-(7-oxanorbornan-2-yl)cyclopentyl 5-norbornene-2-carboxylate/vinylheptamethylcyclotetrasiloxane/maleic anhydride copolymer (37:13:50), designated Polymer 6.

Polymer 6 had a weight average molecular weight (Mw) of 7,300 as measured by the light scattering method and a dispersity (Mw/Mn) of 1.68 as determined from the GPC elution curve. A $^1$H-NMR analysis demonstrated that Polymer 6 consisted of recurring units derived from the monomers in a molar ratio of 37:13:50.

Synthesis Example 7

Synthesis of 1-(7-oxanorbornan-2-yl)cyclopentyl methacrylate/3-oxo-2,7-dioxatricyclo[4.2.1.0$^{4,8}$]-9-nonane methacrylate/Monomer 8 copolymer (42:58:10), Polymer 7

In a 1-liter flask, 66.2 g of Monomer 2, 98.2 g of Monomer 6, and 102.0 g of Monomer 8 were dissolved in 300 ml of THF. The reactor was cooled to −70° C., and vacuum extraction and nitrogen blow were repeated three times until the system was thoroughly purged of oxygen. In the nitrogen atmosphere, 5 g of the initiator AIBN was added to the flask, which was heated to 60° C., whereupon polymerization reaction was conducted for 24 hours.

The polymer product was worked up by pouring the reaction mixture into a solvent mixture of hexane/ether (3/2) for precipitation. The polymer was separated. There was obtained 225 g of a white polymer that is a 1-(7-oxanorbornan-2-yl)cyclopentyl methacrylate/3-oxo-2,7-dioxatricyclo[4.2.1.0$^{4,8}$]-9-nonane methacrylate/Monomer 8 copolymer, designated Polymer 7.

Polymer 7 had a weight average molecular weight (Mw) of 17,100 as measured by the light scattering method and a dispersity (Mw/Mn) of 1.98 as determined from the GPC elution curve. A $^1$H-NMR analysis demonstrated that Polymer 7 consisted of recurring units derived from the monomers in a molar ratio of 42:58:10.

Comparative Synthesis Example 1

Synthesis of tris(trimethylsilyl)silylethyl methacrylate/p-hydroxystyrene copolymer (15:85), Comparative Polymer 1

In a 1-liter flask, 85 g of tris(trimethylsilyl)-silylethyl methacrylate (Monomer 5) and 220 g of p-hydroxystyrene were dissolved in 630 ml of toluene. The flask was thoroughly purged of oxygen and then charged with 6.6 g of the initiator AIBN. The flask was heated to 60° C., at which polymerization reaction was conducted for 24 hours.

The polymer product was worked up by pouring the reaction mixture into a solvent mixture of hexane/ether (3/2) for precipitation. The polymer was separated. There was obtained 191 g of a white polymer that is a tris(trimethylsilyl)silylethyl methacrylate/p-hydroxystyrene copolymer (copolymerization ratio 15:85), designated Comparative Polymer 1.

Comparative Polymer 1 had a Mw of 13,500 as measured by the light scattering method and a dispersity (Mw/Mn) of 1.58 as determined from the GPC elution curve. A $^1$H-NMR analysis demonstrated that Comparative Polymer 1 consisted of the monomers in a molar ratio of approximately 15:85.

(2) Dry Etching Test

A polymer solution was prepared by thoroughly dissolving 1 g of each of the above-synthesized polymers in 5 g of propylene glycol monomethyl ether acetate and passing the solution through a 0.1-micron filter. The polymer solution was spin coated to a silicon wafer and baked at 100° C. for 90 seconds to form a polymer film of 500 nm thick. The wafer having the polymer film formed thereon was subjected to dry etching under two sets of conditions. A difference in polymer film thickness before and after the etching test was determined.

[1] $O_2$ Etching Test:

Using a dry etching instrument TE-8500P by Tokyo Electron K.K., the resist films were etched with oxygen gas under the following conditions.

| | |
|---|---|
| Chamber pressure | 450 mTorr |
| RF power | 600 W |
| Ar gas flow rate | 40 sccm |
| $O_2$ gas flow rate | 60 sccm |
| Gap | 9 mm |
| Time | 60 sec |

[2] $Cl_2/BCl_3$ Etching Test:

Using a dry etching instrument L-507D-L by Nichiden Anerba K.K., the resist films were etched with halide gases under the following conditions.

| | |
|---|---|
| Chamber pressure | 300 mTorr |
| RF power | 300 W |
| Gap | 9 mm |
| $Cl_2$ gas flow rate | 30 sccm |
| $BCl_3$ gas flow rate | 30 sccm |
| $CHF_3$ gas flow rate | 100 sccm |
| $O_2$ gas flow rate | 2 sccm |
| Time | 60 sec |

The results are shown in Table 1.

TABLE 1

| Polymer | $O_2$ gas etching rate (nm/min) | $Cl_2/BCl_3$ gas etching rate (nm/min) |
|---|---|---|
| Polymer 1 | 302 | 266 |
| Polymer 2 | 322 | 288 |
| Polymer 3 | 330 | 282 |
| Polymer 4 | 333 | 276 |

TABLE 1-continued

| Polymer | $O_2$ gas etching rate (nm/min) | $Cl_2/BCl_3$ gas etching rate (nm/min) |
|---|---|---|
| Polymer 5 | 258 | 289 |
| Polymer 6 | 256 | 292 |
| Polymer 7 | 188 | 305 |
| Comparative Polymer 1 | 380 | 250 |

(3) Resist Evaluation

Resist solutions were prepared by thoroughly dissolving each of the above-synthesized silicone polymers, photoacid generator (PAG1, PAG2), base (tributylamine, TMMEA, AAA, AACN) and dissolution inhibitor (DRI1, DRI2) in 1,000 parts by weight of propylene glycol monomethyl ether acetate (PGMEA) containing 0.01% by weight of surfactant FC-430 (Sumitomo 3M Ltd.) in the combination and amounts shown in Table 2, followed by filtration through a 0.1-micron Teflon® filter.

A novolac base resist material OFPR-800 (Tokyo Ouka Kogyo K.K.) was applied onto on a silicon wafer and heat cured at 300° C. for 5 minutes to form a lower layer of 0.5 µm thick. An antireflective material DUV-30 (Brewer Science) was spin coated onto the lower layer and baked at 110° C. for 30 seconds and then at 200° C. for 60 seconds, forming an antireflective film of 55 nm thick.

Each resist solution was spin coated onto the cured DUV-30/novolac resist and baked on a hot plate at 120° C. for 60 seconds to form a resist film of 0.2 µm thick. The resist film was exposed using an KrF excimer laser stepper S203B (Nikon Corporation; NA 0.68, σ 0.75, 2/3 annular illumination), then baked (PEB) at 120° C. for 60 seconds, and developed for 60 seconds with a 2.38% aqueous solution of tetramethylammonium hydroxide (TMAH), thereby giving a positive pattern.

The resist pattern was evaluated as follows. The sensitivity of the resist is the optimum exposure dose (Eop) which provided a 0.15 µm line-and-space pattern in a ratio of 1:1. The resolution is defined as the minimum line width (µm) of the line-and-space pattern that separated at this exposure dose.

Line edge roughness was measured on a 0.15 µm line-and-space pattern at 1:1, and measurements were computed as 3σ.

For a 0.15 µm line-and-space pattern with a solitary line at 1:10, the space was observed under SEM for the presence of residues and the amount of residues if any.

The results are shown in Table 2.

TABLE 2

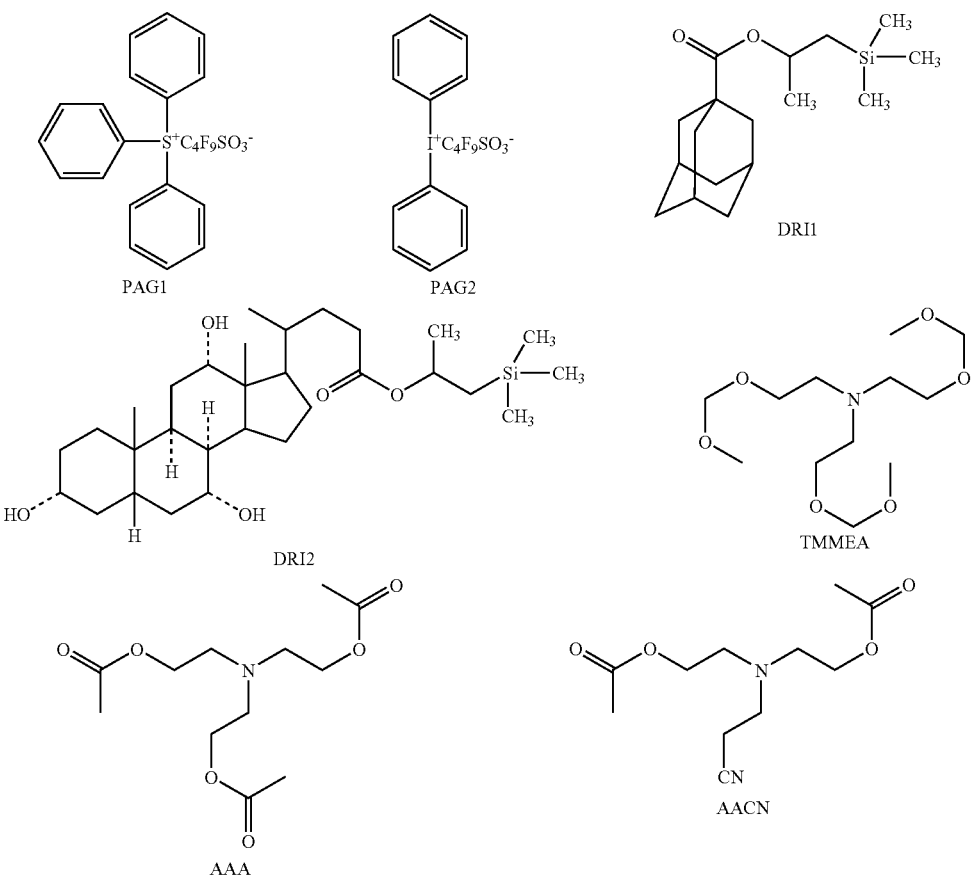

| Polymer (pbw) | Photoacid generator (pbw) | Basic compound (pbw) | Dissolution inhibitor (pbw) | Sensitivity, mJ/cm$^2$ | Resolution, μm | Line edge roughness, nm | Residues in space |
|---|---|---|---|---|---|---|---|
| Polymer 1 (100) | PAG1 (2) | tributylamine (0.1) | — | 22 | 0.13 | 5.3 | nil |
| Polymer 2 (100) | PAG1 (2) | tributylamine (0.1) | — | 23 | 0.13 | 5.6 | nil |
| Polymer 3 (100) | PAG1 (2) | tributylamine (0.1) | — | 20 | 0.13 | 4.3 | nil |
| Polymer 4 (100) | PAG1 (2) | tributylamine (0.1 | — | 22 | 0.13 | 4.1 | nil |
| Polymer 5 (100) | PAG1 (2) | tributylamine (0.1) | — | 45 | 0.13 | 4.8 | nil |
| Polymer 6 (100) | PAG1 (2) | tributylamine (0.1) | — | 48 | 0.13 | 4.5 | nil |
| Polymer 7 (100) | PAG1 (2) | tributylamine (0.1) | — | 55 | 0.13 | 6.8 | nil |
| Polymer 1 (100) | PAG2 (2) | tributylamine (0.1) | — | 16 | 0.13 | 5.9 | nil |
| Polymer 1 (100) | PAG1 (2) | TMMEA (0.2) | — | 32 | 0.13 | 5.5 | nil |
| Polymer 1 (100) | PAG1 (2) | AAA (0.2) | — | 37 | 0.13 | 5.8 | nil |
| Polymer 1 (100) | PAG1 (2) | AACN (0.2) | — | 39 | 0.12 | 5.5 | nil |
| Polymer 1 (100) | PAG1 (2) | tributylamine (0.1) | DRI1 | 19 | 0.13 | 5.2 | nil |
| Polymer 1 (100) | PAG1 (2) | tributylamine (0.1) | DRI2 | 18 | 0.13 | 5.0 | nil |
| Comparative Polymer 1 (100) | PAG1 (2) | tributylamine (0.1) | — | 38 | 0.14 | 9.5 | large amount, space filled with residues |

Japanese Patent Application Nos. 2003-021416 and 2003-194033 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units containing silicon and recurring units having a substituent group of the general formula (1):

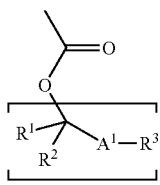
(1)

wherein $A^1$ is a divalent group selected from furandiyl, tetrahydrofurandiyl and oxanorbornanediyl, $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached, and $R^3$ is hydrogen or a straight, branched or cyclic monovalent hydrocarbon group of 1 to 10 carbon atoms which may contain a hetero atom.

2. A polymer comprising recurring units containing silicon and recurring units having a substituent group of the general formula (2):

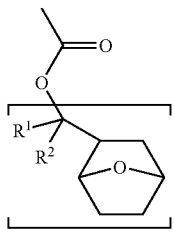
(2)

wherein $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached.

3. A polymer comprising recurring units containing silicon and recurring units having a substituent group of the general formula (3):

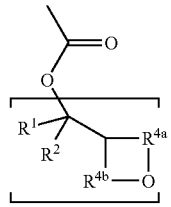
(3)

wherein $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached, and $R^{4a}$ and $R^{4b}$ each are a single bond or an alkylene or alkenylene group of 1 to 4 carbon atoms, the total number of carbon atoms in $R^{4a}$ and $R^{4b}$ being from 3 to 6.

4. A polymer comprising recurring units containing silicon and recurring units of at least one type selected from the general formulae (4) to (8):

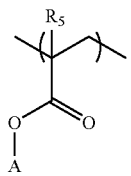
(4)

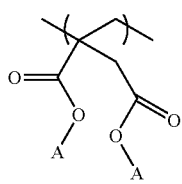
(5)

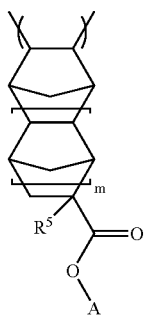
(6)

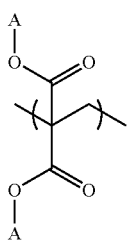
(7)

-continued

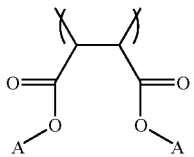
(8)

wherein R⁵ is hydrogen or methyl, m is 0 or 1, A is a group selected from the following formulae (1a), (2a) and (3a), a plurality of A's may be the same or different,

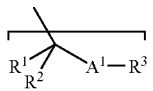
(1a)

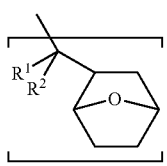
(2a)

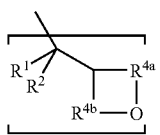
(3a)

wherein $A^1$ is a divalent group selected from furandiyl, tetrahydrofurandiyl and oxanorbornanediyl, $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached, and $R^3$ is hydrogen or a straight, branched or cyclic monovalent hydrocarbon group of 1 to 10 carbon atoms which may contain a hetero atom, and $R^{4a}$ and $R^{4b}$ each are a single bond or an alkylene or alkenylene group of 1 to 4 carbon atoms, the total number of carbon atoms in $R^{4a}$ and $R^{4b}$ being from 3 to 6.

5. The polymer of any one of claims 1 to 4 wherein the recurring units containing silicon have the general formula (9):

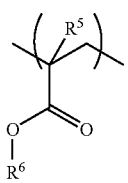
(9)

wherein R⁵ is hydrogen or methyl, and R⁶ is a silicon-containing group selected from the general formulae (10), (11), (12), (13), (14), (15) and (16):

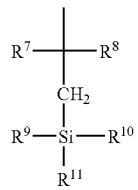
(10)

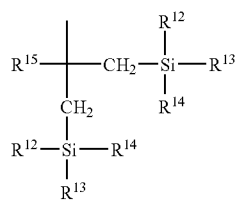
(11)

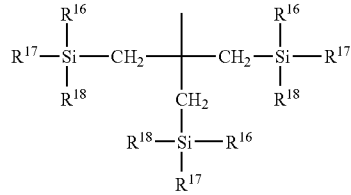
(12)

wherein each of $R^7$, $R^8$ and $R^{15}$ is hydrogen or a straight, branched or cyclic alkyl group of 1 to 10 carbon atoms, each of $R^9$, $R^{10}$, $R^{11}$, $R^{12}$, $R^{13}$, $R^{14}$, $R^{16}$, $R^{17}$ and $R^{18}$ is a straight, branched or cyclic alkyl group of 1 to 10 carbon atoms, an aryl group of 6 to 10 carbon atoms, a trialkylsilyl group, or a silicon-containing group which forms a siloxane or silalkylene bond with the silicon atom in each formula, or $R^7$ and $R^8$ taken together may form an aliphatic hydrocarbon ring of 3 to 10 carbon atoms with the carbon atom to which they are attached, a pair of $R^9$ and $R^{10}$, $R^9$ and $R^{11}$, $R^{10}$ and $R^{11}$, $R^{12}$, and $R^{13}$, $R^{12}$ and $R^{14}$, $R^{13}$ and $R^{14}$, $R^{16}$ and $R^{17}$, $R^{16}$ and $R^{18}$, and $R^{17}$ and $R^{18}$, taken together, may form a polysiloxane ring of 3 to 10 silicon atoms with the silicon atom to which they are attached,

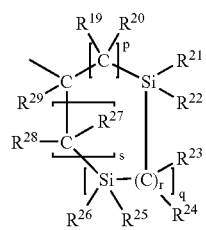
(13)

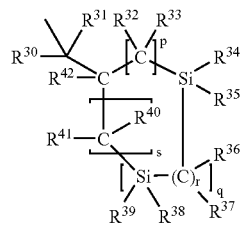
(14)

wherein each of $R^{29}$, $R^{30}$ and $R^{31}$ is a straight, branched or cyclic alkyl group of 1 to 20 carbon atoms, each of $R^{19}$, $R^{20}$, $R^{23}$, $R^{24}$, $R^{27}$, $R^{28}$, $R^{32}$, $R^{33}$, $R^{36}$, $R^{37}$, $R^{40}$, $R^{41}$ and $R^{42}$ is hydrogen or a straight, branched or cyclic alkyl group of 1 to 20 carbon atoms, each of $R^{21}$, $R^{22}$, $R^{25}$, $R^{26}$, $R^{34}$, $R^{35}$, $R^{38}$ and $R^{39}$ is hydrogen, a straight, branched or cyclic alkyl group of 1 to 20 carbon atoms, a straight, branched or cyclic fluorinated alkyl group of 1 to 20 carbon atoms, or an aryl group of 6 to 20 carbon atoms, p, q, r and s each are an integer of 0 to 10, satisfying $1 \leq p+q+s \leq 20$,

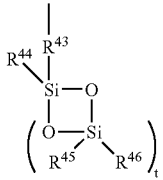
(15)

wherein $R^{43}$ is an alkylene group of 2 to 4 carbon atoms, each of $R^{44}$, $R^{45}$ and $R^{46}$ is a straight, branched or cyclic alkyl group of 1 to 10 carbon atoms or an aryl group of 6 to 10 carbon atoms, t is an integer of 2 to 10,

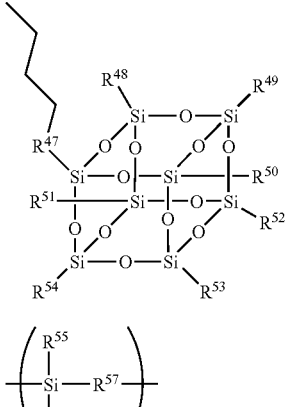
(16)

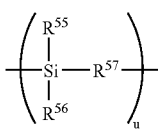
(17)

wherein each of $R^{48}$ to $R^{54}$ is independently hydrogen or a straight, branched or cyclic alkyl or fluorinated alkyl group of 1 to 10 carbon atoms, which may contain an ether, lactone, ester, hydroxy or cyano group, $R^{47}$ is a single bond or a linking group of formula (17), $R^{55}$ and $R^{56}$ each are a straight, branched or cyclic alkyl group of 1 to 10 carbon atoms, $R^{57}$ is a single bond, an oxygen atom or an alkylene group of 1 to 4 carbon atoms, and u is an integer of 1 to 20.

6. The polymer of any one of claims 1 to 4 wherein the recurring units containing silicon have the general formula (18):

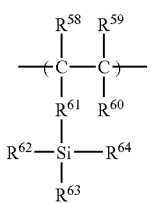
(18)

wherein each of $R^{58}$, $R^{59}$ and $R^{60}$ is hydrogen or a straight, branched or cyclic alkyl group of 1 to 10 carbon atoms, $R^{61}$ is a single bond or a straight, branched or cyclic alkylene group of 1 to 10 carbon atoms, each of $R^{62}$, $R^{63}$ and $R^{64}$ is independently a straight, branched or cyclic alkyl or haloalkyl group of 1 to 20 carbon atoms, an aryl group of 6 to 20 carbon atoms, a trialkylsilyl group, or a silicon-containing group which forms a siloxane or silalkylene bond with the silicon atom in each formula, or $R^{62}$ and $R^{63}$, $R^{62}$ and $R^{64}$, or $R^{63}$ and $R^{64}$, taken together, may form a polysiloxane ring with the silicon atom to which they are attached.

7. A resist composition comprising the polymer as set forth in claim 1.

8. A chemically amplified positive resist composition comprising
(A) the polymer as set forth in claim 1,
(B) a photoacid generator, and
(C) an organic solvent.

9. A chemically amplified positive resist composition comprising
(A) the polymer as set forth in claim 1,
(B) a photoacid generator,
(C) an organic solvent, and
(D) a dissolution inhibitor.

10. The chemically amplified positive resist composition of claim 8 or 9, further comprising (E) a basic compound.

11. A process for forming a resist pattern comprising the steps of:
(i) applying the chemically amplified positive resist composition of claim 8 onto a substrate to form a coating,
(ii) heat treating the coating and then exposing it to high energy radiation having a wavelength of up to 300 nm or electron beam through a photomask, and
(iii) optionally heat treating the exposed coating and developing it with a developer to form a resist pattern.

12. The pattern forming process of claim 11 wherein the substrate bears thereon an underlay on which the coating of the resist composition is formed, said process further comprising the step of treating the underlay by an etching process including oxygen plasma etching, after the resist pattern formation.

13. The pattern forming process of claim 11 wherein the substrate bears thereon an underlay on which the coating of the resist composition is formed, said process further comprising the step of treating the underlay by etching with a halogen gas containing chlorine or bromine, after the resist pattern formation.

14. A polymer comprising recurring units containing silicon and recurring units of at least one type selected from the general formulae (4) to (8):

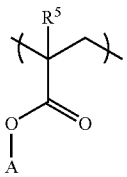
(4)

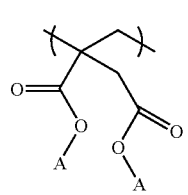
(5)

-continued (6)

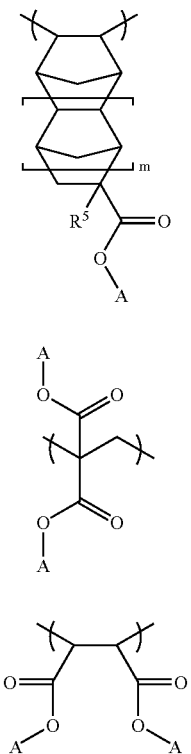

(7)

(8)

wherein $R^5$ is hydrogen or methyl, m is 0 or 1, A is a group selected from the following formulae (1a), (2a) and (3a), a plurality of A's may be the same or different,

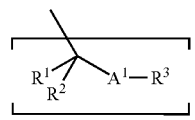

(1a)

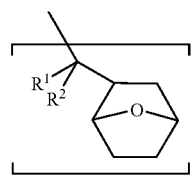

(2a)

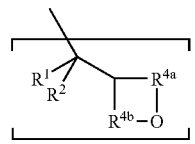

(3a)

wherein $A^1$ is a divalent group selected from furandiyl, tetrahydrofurandiyl and oxanorbornanedlyl, $R^1$ and $R^2$ are independently selected from straight, branched or cyclic monovalent hydrocarbon groups of 1 to 10 carbon atoms, or $R^1$ and $R^2$ taken together may form an aliphatic hydrocarbon ring with the carbon atom to which they are attached, provided that in formula (2a), $R^1$ and $R^2$ taken together form an aliphatic hydrocarbon ring with the carbon atom to which they are attached, and $R^3$ is hydrogen or a straight, branched or cyclic monovalent hydrocarbon group of 1 to 10 carbon atoms which may contain a hetero atom, and $R^{4a}$ and $R^{4b}$ each are a single bond or an alkylene or alkenylene group of 1 to 4 carbon atoms, the total number of carbon atoms in $R^{4a}$ and $R^{4b}$ being from 3 to 6.

* * * * *